United States Patent
Kapoor et al.

(10) Patent No.: US 12,322,582 B2
(45) Date of Patent: Jun. 3, 2025

(54) ANOMALOUS PLASMA EVENT DETECTION AND MITIGATION IN SEMICONDUCTOR PROCESSING

(71) Applicant: Lam Research Corporation, Fremont, CA (US)

(72) Inventors: Sunil Kapoor, Vancouver, WA (US); Karl Frederick Leeser, West Linn, OR (US); Noah Baker, West Linn, OR (US); Liang Meng, Sherwood, OR (US); Yukinori Sakiyama, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 617 days.

(21) Appl. No.: 17/310,574

(22) PCT Filed: Feb. 7, 2020

(86) PCT No.: PCT/US2020/017193
§ 371 (c)(1),
(2) Date: Aug. 11, 2021

(87) PCT Pub. No.: WO2020/167601
PCT Pub. Date: Aug. 20, 2020

(65) Prior Publication Data
US 2022/0037135 A1 Feb. 3, 2022

Related U.S. Application Data

(60) Provisional application No. 62/805,416, filed on Feb. 14, 2019, provisional application No. 62/805,261, filed on Feb. 13, 2019.

(51) Int. Cl.
*H01J 37/32* (2006.01)

(52) U.S. Cl.
CPC .. *H01J 37/32944* (2013.01); *H01J 37/32165* (2013.01); *H01J 37/32972* (2013.01)

(58) Field of Classification Search
CPC ............. H01J 37/32944; H01J 37/32; H01J 37/32165; H01J 37/32972;
(Continued)

(56) References Cited

U.S. PATENT DOCUMENTS 5,571,366 A * 11/1996 Ishii .................... H01J 37/3299
216/60
5,717,187 A 2/1998 Rogozinski et al.
(Continued)

FOREIGN PATENT DOCUMENTS

CN 105389289 A 3/2016
CN 105474378 A 4/2016
(Continued)

OTHER PUBLICATIONS

International Preliminary Report on Patentability dated Aug. 26, 2021 issued in Application No. PCT/US2020/017193.
(Continued)

*Primary Examiner* — Nikolay K Yushin
(74) *Attorney, Agent, or Firm* — Weaver Austin Villeneuve & Sampson LLP

(57) ABSTRACT

In particular embodiments, anomalous plasma events, which may include formation of an electric arc in a semiconductor processing chamber, may be detected and mitigated. In certain embodiments, a method may include detecting an optical signal emitted by a plasma, converting the optical signal to a voltage signal, and forming an adjusted voltage signal. Responsive to determining that the changes associated with the adjusted voltage signal exceed a threshold, an output power of an RF signal coupled to the chamber may (Continued)

be adjusted. Such adjustment may mitigate formation of the anomalous plasma event occurring within the chamber.

19 Claims, 15 Drawing Sheets

(58) Field of Classification Search
CPC ............... H01J 37/32917; H01J 37/244; H01J 37/32082; H01J 37/32357; H01J 37/32366; H01J 37/32394; H01J 37/32403; H01J 2237/24564; H01J 37/32935; H05H 1/0025; H05H 1/00; H05H 1/0031; H05H 1/0043; H01L 21/67248; H01L 21/67109; H01L 21/67069; H01L 21/3065
See application file for complete search history.

(56) References Cited

U.S. PATENT DOCUMENTS

| | | | |
|---|---|---|---|
| 8,440,061 B2 | 5/2013 | Valcore, Jr. et al. | |
| 8,822,948 B1* | 9/2014 | Hartwell | H01J 37/08 250/306 |
| 9,627,186 B2* | 4/2017 | Valcore, Jr. | G01J 1/42 |
| 10,121,708 B2* | 11/2018 | Sakiyama | H01J 37/32082 |
| 10,365,212 B2* | 7/2019 | Kueny | G01J 3/0289 |
| 2008/0061793 A1 | 3/2008 | Anwar et al. | |
| 2011/0215072 A1 | 9/2011 | Park et al. | |
| 2012/0037188 A1 | 2/2012 | McCormick et al. | |
| 2013/0103347 A1 | 4/2013 | Jun et al. | |
| 2015/0241272 A1 | 8/2015 | Lian et al. | |
| 2016/0064199 A1* | 3/2016 | Valcore, Jr. | H01J 37/32972 250/206 |
| 2017/0141001 A1* | 5/2017 | Sakiyama | C23C 16/52 |
| 2017/0200658 A1 | 7/2017 | Yang et al. | |
| 2018/0136118 A1* | 5/2018 | Kueny | H05H 1/0006 |
| 2018/0269119 A1 | 9/2018 | Coppa et al. | |
| 2022/0406578 A1 | 12/2022 | Sakiyama et al. | |

FOREIGN PATENT DOCUMENTS

| | | |
|---|---|---|
| EP | 1191569 A2 | 3/2002 |
| JP | H11288921 A | 10/1999 |
| JP | 2003173973 A | 6/2003 |
| KR | 20080006750 A | 1/2008 |
| KR | 20120127349 A | 11/2012 |
| TW | 201536116 A | 9/2015 |
| WO | WO-2012039867 A1 | 3/2012 |

OTHER PUBLICATIONS

International Preliminary Report on Patentability dated Jun. 2, 2022, in PCT Application No. PCT/US2020/061052.
International Search Report and Written Opinion dated Mar. 11, 2021 issued in Application No. PCT/US2020/061052.
International Search Report and Written Opinion dated Sep. 16, 2020 issued in Application No. PCT/US2020/017193.
CN Office Action dated Sep. 28, 2023 in Application No. 202080028432.7, with English translation.
JP Office Action dated Nov. 21, 2023 in JP Application No. 2021-547159, with English translation.
SG Written Opinion dated Apr. 21, 2023 in SG Application No. 11202108726S.
TW Office Action dated Jan. 10, 2024 in TW Application No. 109104147, with English Translation.
CN Office Action dated Mar. 5, 2024 in CN Application No. 202080028432.7, with English translation.
JP Office Action dated Mar. 19, 2024 in JP Application No. 2021-547159, with English translation.
SG Written Opinion dated Apr. 23, 2024 in SG Application No. 11202108726S.

* cited by examiner

ANOMALOUS PLASMA EVENT DETECTION AND MITIGATION IN SEMICONDUCTOR PROCESSING

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Semiconductor processing often involves the use of a plasma in a fabrication chamber; during such operations, an anomalous plasma event can occur in response to the electrical conditions used to generate the plasma. An anomalous plasma event can include, for example, formation of an electrical arc, or other type of visible event generated by an electrical discharge between or among two or more localized plasma regions within a process station. An anomalous plasma event may bring about excessive heating and/or excessive electrical current, which may damage a semiconductor wafer undergoing processing. In some instances, an anomalous plasma event may bring about damage to a semiconductor process station.

SUMMARY

An implementation may include a method of detecting an anomalous plasma event in a semiconductor processing chamber. Such an implementation may include detecting an optical signal emitted by a plasma in the semiconductor processing chamber, where the plasma is formed in response to an RF signal from an RF generator. The method can also include converting the optical signal to a voltage signal and adjusting the voltage signal to form an adjusted voltage signal. The method can further include determining whether changes associated with the adjusted voltage signal exceed a threshold and adjusting, based at least in part on the determination, an output parameter of the RF signal from the RF generator.

In particular implementations, the method may include adjusting the voltage signal to form the adjusted voltage signal by filtering the voltage signal with a low-pass filter. Determining whether changes associated with the adjusted voltage exceed a threshold can include comparing the changes of the voltage signal to the adjusted voltage signal. Adjusting the voltage signal to form the adjusted voltage signal can include applying an offset to the adjusted voltage signal. Adjusting the voltage signal to form the adjusted voltage signal can include taking a first derivative of the voltage signal. Adjusting of the output parameter of the RF generator can include lowering an output power of the RF generator from a first power level to a second power level. The method can further include maintaining, after lowering the output power of the RF generator from the first power level to the second power level and maintaining the output power of the RF generator at the second power level for a first time period. The method can also include after the maintaining, increasing the output power of the RF generator from the second power level to the first power level for a second time period. The second power level can be a non-zero power level. Alternatively, second power level can be zero. The method can further include: determining, based at least in part on light intensity within the semiconductor processing chamber or process parameters, a first amount of RF power reduction, and reducing an output power level of the RF generator by the first amount, where the process parameters can include one or more process parameters selected from the group including of: DC power level, RF bias power level, station-to-station RF power variations, frequency tuning parameters, pressure, and temperature.

In one or more implementations, a semiconductor processing tool can include a semiconductor processing chamber. The semiconductor processing tool can include an RF generator configured to provide RF power to the semiconductor processing chamber to generate and to maintain a plasma. The semiconductor processing tool can also include a photodetector configured to detect an optical signal indicative of a plasma's luminescence in the semiconductor processing chamber. The photodetector can be configured to convert the optical signal to a voltage signal utilizing a slope change detection unit. The semiconductor processing tool can also include receiving the voltage signal. And adjusting the voltage signal to form an adjusted voltage signal. The semiconductor processing tool can be configured to determine whether changes associated with the adjusted voltage signal exceed a threshold. In an implementation, in response to the determination, the semiconductor processing tool can cause a signal to be sent to the RF generator that is configured to cause an adjustment to the RF generator.

In some implementations, the semiconductor processing tool can further include a lens on the semiconductor processing chamber configured to allow light within the semiconductor processing chamber to pass through the lens. The semiconductor processing tool can also include a fiber optic cable between the lens and the photodetector and can be configured to convey at least a portion of the light that passes through the lens to reach the photodetector. The slope change detection unit of the semiconductor processing tool can further include a filter to filter the voltage signal to convert the voltage signal to the adjusted voltage signal. The semiconductor processing tool can also include a comparator to compare changes between the adjusted voltage signal and the voltage signal. The comparator of the semiconductor processing tool can include transistor-transistor logic (TTL) configured to send a TTL signal to the RF generator. The RF generator can be configured to reduce the RF power from a first power level to a second power level in response to receiving the signal from the slope change detection unit. The slope change detection unit can include a differentiator configured to take a derivative of the voltage signal to convert the voltage signal to the adjusted voltage signal. The semiconductor processing tool can also include a comparator configured to determine whether the changes of the adjusted voltage signal exceed the threshold. The semiconductor processing tool can further include a fiber optic cable between the semiconductor processing chamber and the photodetector configured to transmit light generated by the plasma in the semiconductor processing chamber to reach the photodetector. The photodetector can be electrically connected to the RF generator in which the optical signal from the semiconductor processing chamber is fed from the semiconductor processing chamber to the RF generator. The photodetector and the slope change detection unit can be positioned outside the semiconductor processing chamber. Alternatively, the photodetector and the slope change detection unit can be positioned between the semiconductor processing chamber and the RF generator. The photodetector and the slope change detection unit can be positioned on the semiconductor processing chamber.

In particular implementations, a method of detecting an anomalous plasma event can include forming a plasma utilizing a signal from an RF generator and detecting a fluctuating optical signal generated by the plasma. The method of detecting can include computing a spectral density of the fluctuating optical signal and determining that the spectral density of the fluctuating optical signal differs from one or more reference spectral densities of a fluctuating optical signal, generated by the plasma, by a threshold amount.

In particular implementations, computing the spectral density of the fluctuating optical signal can utilize a Fast Fourier Transform (FFT). The method can include one or more reference spectral densities of a fluctuating optical signal corresponding to spectral densities of a fluctuating optical signal generated by a plasma maintained under nominal conditions. The threshold amount can correspond to one standard deviation relative to the spectral density of the fluctuating optical signal from the plasma maintained under nominal conditions. The threshold amount can correspond to two standard deviations relative to the spectral density of the fluctuating optical signal from the plasma maintained under nominal conditions. The spectral density of the fluctuating optical signal can include determining the spectral density of the fluctuating optical signal at a frequency of about 400 kHz. Computing the spectral density of the fluctuating optical signal can include determining the spectral density of the fluctuating optical signal at a frequency of between about 400 kHz and about 4 MHz. Computing the spectral density of the fluctuating optical signal can include determining the spectral density of the fluctuating optical signal at a plurality of frequencies generated by one or more RF generators.

In particular implementations, an apparatus may include a signal processor configured to analyze output signals from a photodetector that receives optical signals from a multi-station processing tool. The signal processor can be additionally adapted to detect a fluctuating optical signal generated by a plasma formed in a semiconductor fabrication chamber, to compute a spectral density of the fluctuating optical signal, and to determine that the spectral density of the fluctuating optical signal differs from one or more reference spectral densities of the fluctuating optical signal, generated by the plasma, by a threshold amount.

In particular implementations, the one or more reference spectral densities of the fluctuating optical signal can correspond to spectral densities computed while the plasma is maintained under nominal conditions. The threshold amount can correspond to one standard deviation relative to the spectral density of the fluctuating optical signal from the plasma maintained under nominal conditions. Alternatively, the threshold amount can correspond to two standard deviations relative to the spectral density of the fluctuating optical signal from the plasma maintained under nominal conditions. The spectral density of the fluctuating optical signal can be computed while an RF signal having a frequency of about 400 kHz is coupled to the multi-station processing tool. The spectral density of the fluctuating optical signal can be computed to determine the spectral density of the fluctuating optical signal at a frequency of between 400 kHz and 4 MHz. The spectral density of the fluctuating optical signal can be computed at a frequency of the RF signal coupled to the multi-station processing tool.

BRIEF DESCRIPTION OF THE DRAWINGS

The various implementations disclosed herein are illustrated by way of example, and not by way of limitation, in the figures of the accompanying drawings, in which like reference numerals refer to similar elements.

DETAILED DESCRIPTION

Figure 1:
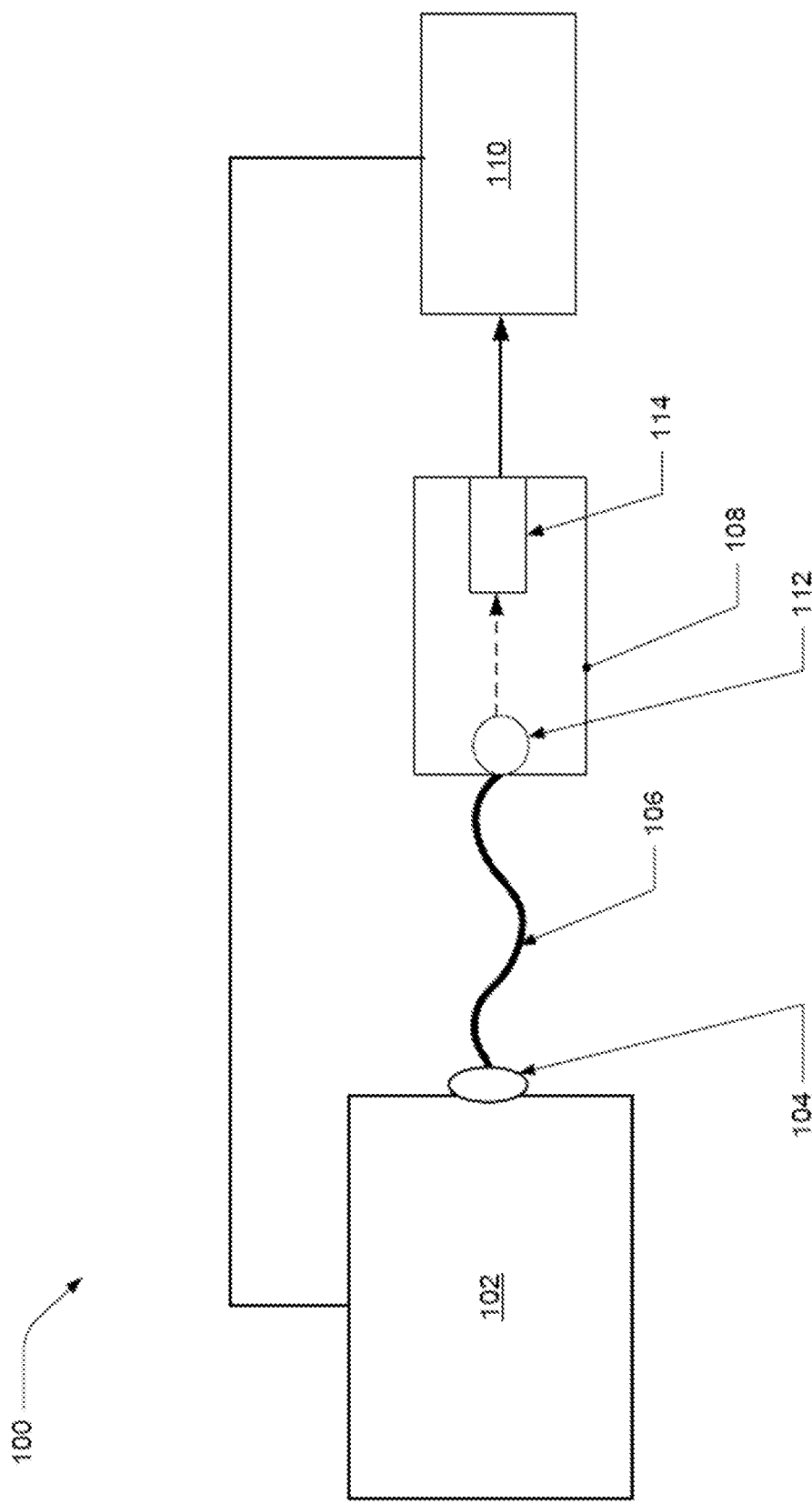
FIG. 1 depicts a first example of an anomalous plasma event detection apparatus.

In the following description, numerous specific details are set forth in order to provide a thorough understanding of the presented embodiments. The disclosed embodiments may be practiced without some or all of these specific details. In other instances, well-known process operations have not been described in detail so as to refrain from unnecessarily obscuring the disclosed embodiments. While the disclosed embodiments are described in conjunction with the specific embodiments, it will be understood that it is not intended to limit the disclosed embodiments.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry may have a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, glass panels, and the like.

Many semiconductor processes use a plasma during one or more aspects of the processing. A plasma is typically generated in a processing chamber between two electrodes, with one electrode connected to a Radio Frequency (RF) power source and the other electrode connected to an RF ground. RF power supplied to the electrode may range between about 200 Watts to about 3000 Watts. The frequency used to drive plasma formation may include a high frequency (HF) component, a low frequency (LF), or both HF and LF components. The HF frequency may be about 13.56 MHz or about 27 MHz; the LF frequency may be between about 300-400 kHz. Other frequencies of high- or low-frequency RF power may be used as well, although a "high" frequency generally indicates a signal frequency that is several orders of magnitude higher than a "low" frequency, e.g., megahertz as compared to kilohertz.

One type of anomalous plasma event that may arise during plasma formation is high-voltage breakdown, "light up," or arcing within the processing chamber, such as areas surrounding a showerhead or a substrate support structure, such as an electrostatic chuck (ESC). When two structures that may serve as electrodes are separated by a gap, arcing or high-voltage breakdown may occur under certain circumstances. These circumstances are typically dependent upon a voltage difference between the electrodes, the composition of the gases between the electrodes, the pressure of gases between the electrodes, and the size of the separation between the electrodes. The interplay between these factors may be characterized by Paschen's law, which provides the high-voltage breakdown voltage as a function of pressure, gap distance, and two gas-dependent parameters. The voltage that is necessary to initiate an anomalous plasma event, such as a light-up or an arc, may be referred to as the "breakdown voltage" and is a function of the gas that fills the volume between the two electrodes, the pressure of that gas, and the distance between the potential endpoints of the electrical arc, for example. This relationship is dictated by Paschen's Law, which states that $$V_B = \frac{apd}{\ln(pd) + b}$$

where "$V_B$" is the breakdown voltage, "p" is the pressure, "d" is the distance, and "a" and "b" are empirically derived constants associated with the gas involved.

Figure 12:
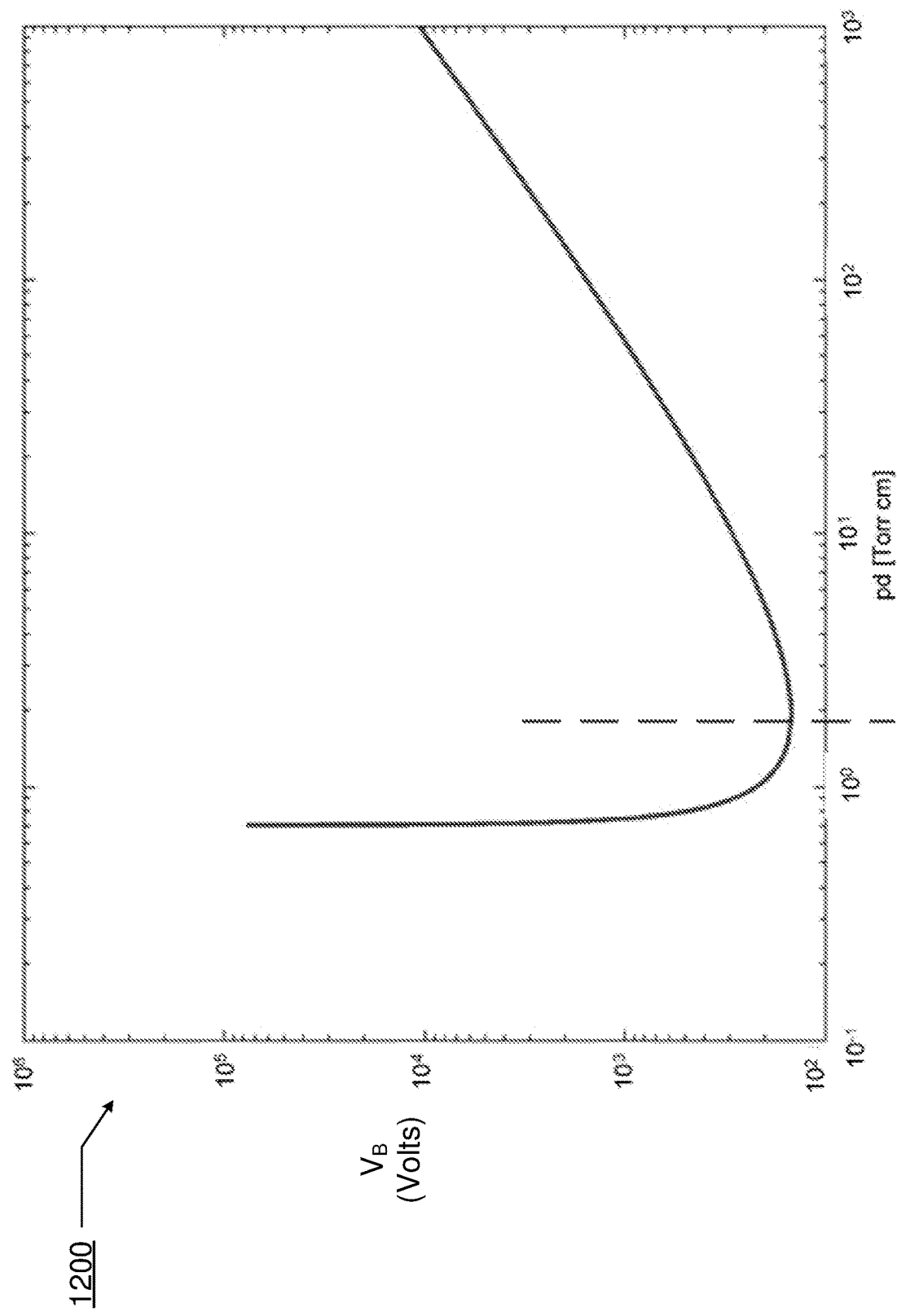
FIG. 12 depicts a Paschen curve for helium gas.

FIG. 12 (embodiment 1200) depicts a Paschen curve for helium gas. The logarithmically graduated vertical axis represents the breakdown voltage in volts (e.g., the voltage necessary to create an arc or other type of anomalous plasma event) while the horizontal axis (also logarithmically graduated) represents the pressure multiplied by the distance in Torr-cm. As shown FIG. 12, the lowest, or minimum, breakdown voltage of approximately 150V is at the lowest point of the Paschen curve, which occurs at approximately 4 Torr-cm. This characteristic creates two regions in which semiconductor processing can occur before the lowest breakdown voltage is reached—the "left side" of the lowest point of the curve and the "right side" of the lowest point of the curve. The dashed vertical line in FIG. 12 approximates the dividing line between these two sides.

Some semiconductor processes utilize higher RF power to bring about a reduction in the deposition time and two increase substrate throughput. However, use of higher RF power may increase the risk of a voltage breakdown, arcing, or other type of anomalous plasma event within the processing chamber. Such events may cause damage to substrates, to electrodes (such as the showerhead or substrate support structure), and to the chamber itself. Unacceptable damage to a substrate may result in scrapping of the substrate and/or may bring about damage to the electrodes. In addition, a damaged chamber may require lengthy, expensive, and/or extensive repairs of the electrodes (e.g., replacing a showerhead or pedestal), which may incur additional costs as well as additional downtime of a semiconductor processing chamber.

It is therefore desirable to detect arcs or other types of anomalous plasma events within the processing chamber and then to mitigate such events. Many conventional anomalous plasma event detection techniques can result in missed and false arc detections. For example, one conventional method may involve a voltage detection method that measures an RF voltage delivered to the driven electrode for generating the plasma and determines whether that voltage has reached, or approached within a specific amount of, a threshold voltage; if so, then such systems assume that arcing may occur within the processing chamber. Responsive to detection of a threshold voltage, the RF power is lowered, or shut off entirely, which, in turn, lowers the voltage in the processing chamber and prevents an anomalous plasma event from occurring. This threshold voltage is generally a predetermined value obtained using experimental measurements. However, this detection method has disadvantages, such as being limited to the single predetermined voltage threshold. Additionally, this detection method may be difficult to implement since the method may require a very fast voltage monitoring speed that is computationally intensive and may be unable to accurately reflect the real-time occurrence of at anomalous plasma event. This inability to accurately reflect the real-time occurrence of an anomalous plasma event may be due to potential time displacement between arc event occurrence and measured voltages. In addition, the detection method may potentially be insensitive to smaller arc events, suffer from system noise, and may require a large amount of time and experimentation to determine and optimize an appropriate threshold voltage.

A threshold voltage detection method may other detection limitations. For instance, such methods generally detect whether the measured voltage has increased above the particular threshold. However, RF drive signals include time-varying voltages that are driven at various frequencies (e.g., a periodic waveform, such as a sinusoidal signal operating at 13.56 MHz), and the intensity of the light emitted by the plasma may oscillate with a similar frequency component in the detector output signal attributable to the normal intensity of light emitted by the plasma responsive to the RF signal is at its nominal peak, then the anomalous plasma event, which causes additional light to be emitted, may be detectable if the threshold voltage is appropriately set. However, if the anomalous plasma event occurs in between successive peaks of the voltage cycle, then the anomalous plasma event may not be detected, especially if the component in the detector output signal attributable to the anomalous plasma event has a magnitude that is less than the amplitude of the component in the detector output signal that is attributable to the RF signal. For instance, assuming that the measured voltage of the detector output signal has a peak amplitude of 0.2 V with an average of 2 V, the voltage may increase to 2.2V at the peak and then decrease to 1.8V at the bottom (such that the peak-to-peak is 0.4V) due to the application of an RF drive signal. If an arc producing a 0.3V increase in the detector output signal occurs during the cycle when the voltage is at the peak of 2.2V, then the measured voltage will be 2.5V which is above a threshold of 2.4V (this threshold may indicate the occurrence of an arc, as determined from experimental results). However, if the arc occurs during the cycle when the voltage is at the bottom of 1.8V, then the measured voltage will be 2.1V (1.8V plus 0.3V) which is below the threshold of 2.4V. The threshold in such systems cannot be set below the peak output signal magnitude produced by application of a normal RF drive signal. Accordingly, this detection method may not be useful in detecting small-voltage anomalous plasma events occurring during certain portions of an alternating (e.g., sinusoidal) voltage cycle.

Another similar technique may monitor for anomalous plasma events optically. Here, similar to the above-described method, a voltage is measured. However, the voltage may be obtained from the output of a photodetector configured to measure the light intensity within the chamber and to generate a voltage signal that is indicative of that light intensity. For example, a plasma formed within the chamber may emit varying amounts of light depending on the behavior of the plasma. The photodetector may thus produce a voltage output signal that is representative of an intensity of light emitted by the plasma. An arc event, however, may generate additional light that results in the voltage produced by the photodetector producing a corresponding voltage increase. This voltage may then be monitored in a manner similar to that discussed above for direct voltage monitoring. This technique, however, suffers from many of the same shortcomings as the direct voltage monitoring discussed above, particularly with respect to being insensitive to small-intensity discharge events that may be unable to be detected if they occur during the local minima of the photodetector signal.

Another limitation to these detection methods is that they may not be able to detect anomalous plasma events that are smaller than the difference between the peak voltage and the threshold voltage. For example, the threshold voltage may be offset above the peak voltage by a particular amount so that each peak voltage, and/or minor inconsequential voltage deviations, do not approach the threshold voltage and, consequently, bring about an alarm or other corrective action. However, harmful anomalous plasma events may occur at voltage that is less than an offset between the peak voltage and the threshold. Accordingly, anomalous plasma events smaller than a difference between a peak voltage and a threshold voltage may not be detected. For example, if an anomalous plasma event of 0.15V occurs at a peak voltage of 2.0V, then the measured voltage will be below the 2.2V threshold and consequently remain undetected and unmitigated.

These conventional detection methods are also disadvantageously sensitive to parameter settings of the processing occurring within the processing chamber. For example, each time a processing parameter is changed, (e.g., RF power, RF frequency, gaseous species, chamber pressure, etc.,) multiple new threshold voltages may be required responsive to an impact of the modified processing parameter on a voltage threshold at which arcing, for example, occurs. Accordingly, modification of parameter settings may require additional experimentation and optimization time, which again may result in unwanted downtime of the semiconductor processing tool.

Accordingly, the present disclosure includes novel techniques and apparatuses for anomalous plasma event detection in semiconductor processing. In general, a plasma may emit light that is detectable by a photodetector, such as a photodetector. Light emitted by the plasma may oscillate or fluctuate at various frequencies based on plasma parameters, such as the chemical species, RF power parameters (voltage, etc.), RF frequency components (e.g., high frequency component, low frequency component, or both), and the like. Some example plasma illumination oscillation frequencies may be on the order of once cycle per tens of milliseconds, such as about 1 cycle per 20 ms. In contrast, the occurrence of an anomalous plasma event generally occurs at a relatively fast, high frequency in relation to other light emitted by the plasma; for example, on the order of one cycle in several nanoseconds.

The techniques discussed below leverage the difference between the optical energy fluctuations that occur during anomalous plasma event frequency when compared to optical energy fluctuations that occur during nominal plasma operation. Such differences may be utilized to identify anomalous plasma events. In some implementations, a determination may be made as to the slope change in the photodetector signal at an instant in time, since an anomalous plasma event, due to its much higher frequency, may bring about an abrupt (e.g., high frequency) change in slope in the photodetector output signal. In other implementations, the photodetector signal may be normalized by removing the lower-frequency portions of the signal, leaving only the higher-frequency portions that may be indicative of anomalous plasma events. In yet other implementations, the photodetector signal may be subjected to, for example, a Fourier analysis (e.g., a fast Fourier transform) or may be subjected to other types of frequency spectrum analysis to determine the magnitude of intensity of various frequency components. In particular implementations, if the analyzed photodetector signal exhibits high-frequency components greater than a certain magnitude, then these frequency components may be indicative of an anomalous plasma event. These anomalous plasma event detection techniques may differ from conventional techniques, such as those described above since, in particular implementations, the anomalous plasma event detection techniques consider the rate of change in the optical signal. This is in contrast to conventional techniques, which rely simply on the magnitude of a detected signal.

FIG. 1 depicts a first example anomalous plasma event detection apparatus, according to an embodiment 100. As shown, in embodiment 100 includes a semiconductor processing chamber 102, a lens 104 (which may be omitted in certain embodiments), a fiber optic cable 106 coupled to lens 104 and to a signal processor 108, and an RF generator 110. The semiconductor processing chamber 102 is discussed in more detail below, but it may be used for any semiconductor processing that utilizes a plasma, such as plasma-enhanced chemical vapor deposition (PECVD), atomic layer deposition (ALD), atomic layer etch (ALE), etc. The RF generator 110 is also described in more detail below and can include a LF power generator, a HF power generator, or both. The lens 104 is positioned within the semiconductor processing chamber 102 to allow light generated within the chamber, including within any processing station in the semiconductor processing chamber 102, to pass through the lens 104, through the fiber optic cable 106 and to the signal processor 108.

The signal processor 108 may include a photodetector, such as a photodetector 112 (which may include a photodiode), that can receive the optical signal from the semiconductor processing chamber 102 and convert the received optical signal to a voltage signal. Photodetector 112 may include any other type of light-detection electronics capable of detecting any number of photons conveying energy at various wavelengths of infrared, visible, and/or ultraviolet light, and may include, for example, a spectrometer. The signal processor 108 may also include a slope change detection unit 114 that is configured to receive the voltage signal from the photodetector 112, as represented by the dashed line between the photodetector and the slope change detection unit 114. The signal processor 108 may be further configured to determine changes in the voltage signal from the photodetector 112 and to determine whether the changes in the voltage signal are indicative of the occurrence of an anomalous plasma event occurring within the semiconductor processing chamber 102.

In some implementations, the slope change detection unit 114 may compare the raw photodetector signal to a filtered version of that same signal to determine high frequency changes between the raw and filtered signals. A comparison between raw and filtered signals may permit a determination that an anomalous plasma event has occurred. In some such implementations, a signal having a high frequency component caused by an anomalous plasma event is compared to a signal that does not have the high frequency component (due to, among other things, use of a low-pass filter applied to the raw voltage signal). Such comparison may permit determination of relative changes between filtered and unfiltered versions of a signal.

Figure 2:
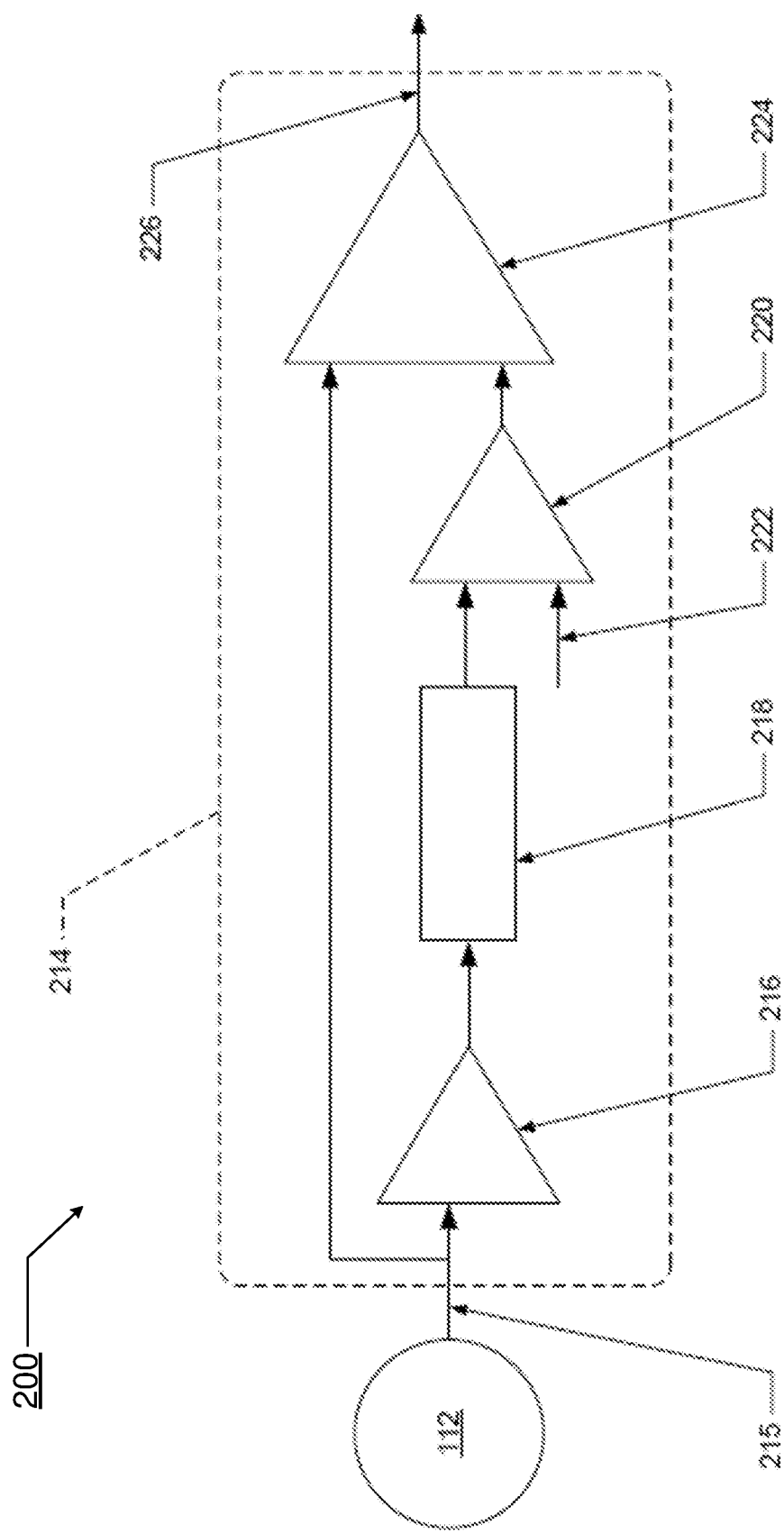
FIG. 2 depicts a first example slope change detection unit capable of detecting an anomalous plasma event.

FIG. 2 depicts a first example slope change detection unit, according to an embodiment 200. Here, the photodetector 112 is shown along with the first example slope change detection unit 214 encompassed by the dashed rectangle. The raw voltage signal 215 from the photodetector 112 is split and transmitted to a filter which may include, in some embodiments, a buffer amplifier 216, a low-pass filter 218, and a feedback amplifier 220 with a threshold/enable signal 222. This filtered signal, along with the raw voltage signal 215, is then transmitted to a high-speed comparator 224. The buffer amplifier 216 may operate to isolate the raw analog data from the low-pass filter 218, which filters out high frequency signals, and the threshold/enable signal 222 brings about an offset of the filtered signal.

In the embodiment of FIG. 2 high-speed comparator 224 operates to compare the raw photodetector voltage signal and the filtered photodetector voltage signal and to determine whether there has been a change between the signals. For example, a determination may be made as to whether the difference between the two signals at a given instant in time exceeds a threshold amount. In response to the difference between filtered and unfiltered signals being greater than the threshold amount, this may indicate that there is a slope change in the raw signal, thus indicating an anomalous plasma event. In particular embodiments, a filtered signal may, as discussed above, be offset from the unfiltered signal by a predetermined offset amount, which may operate to avoid scenarios in which the two signals may cross each other (other than due to an anomalous plasma event). The high-speed comparator 224 may also include Transistor-Transistor Logic (TTL) that can change an output signal 226 from a first voltage to a second voltage responsive to a detected change between the filtered and unfiltered signals being greater than a first threshold.

Figure 3A:
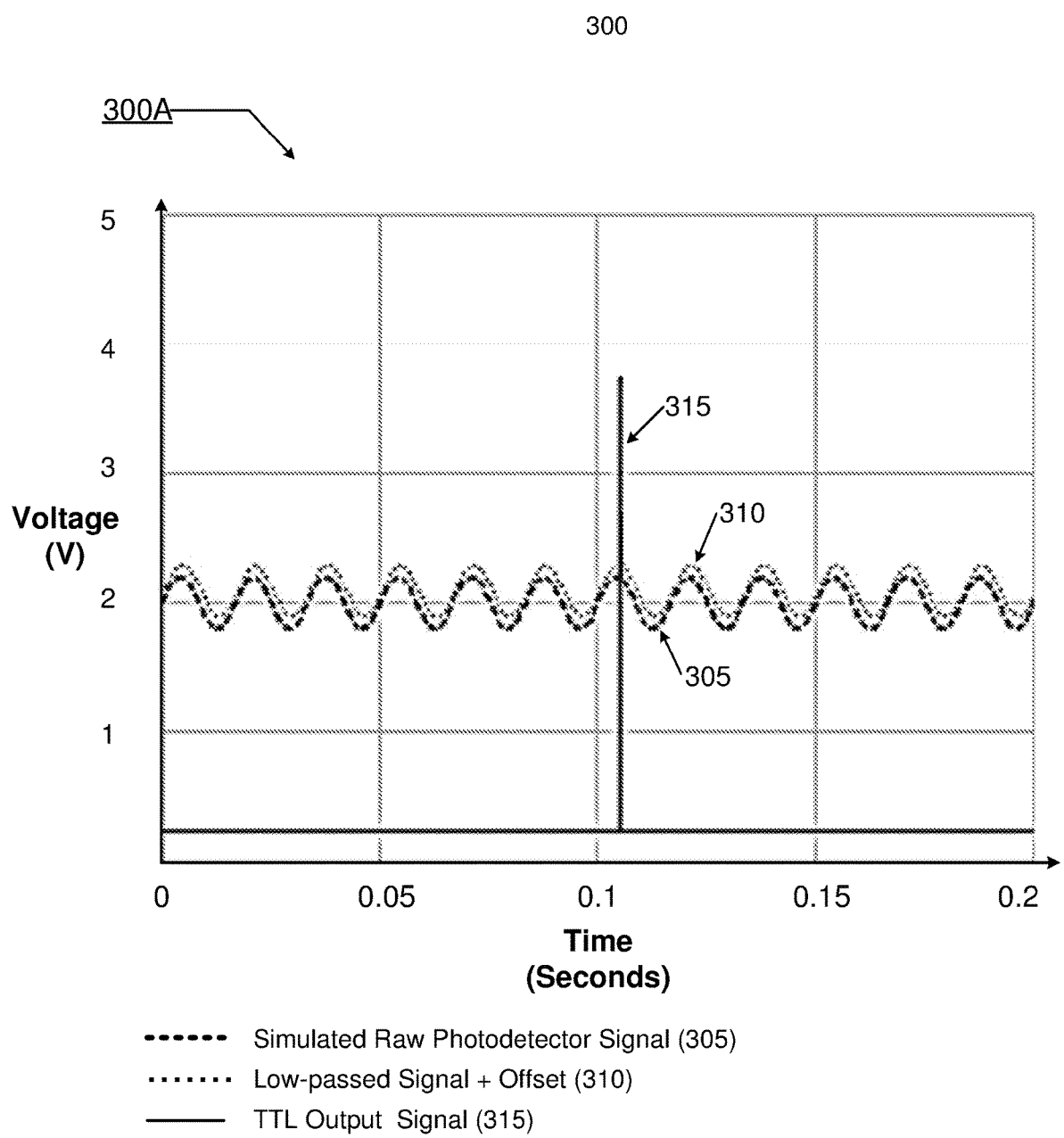
FIGS. 3A and 3B depict waveforms representing an example detection response of a slope change detection unit.
Figure 3B:
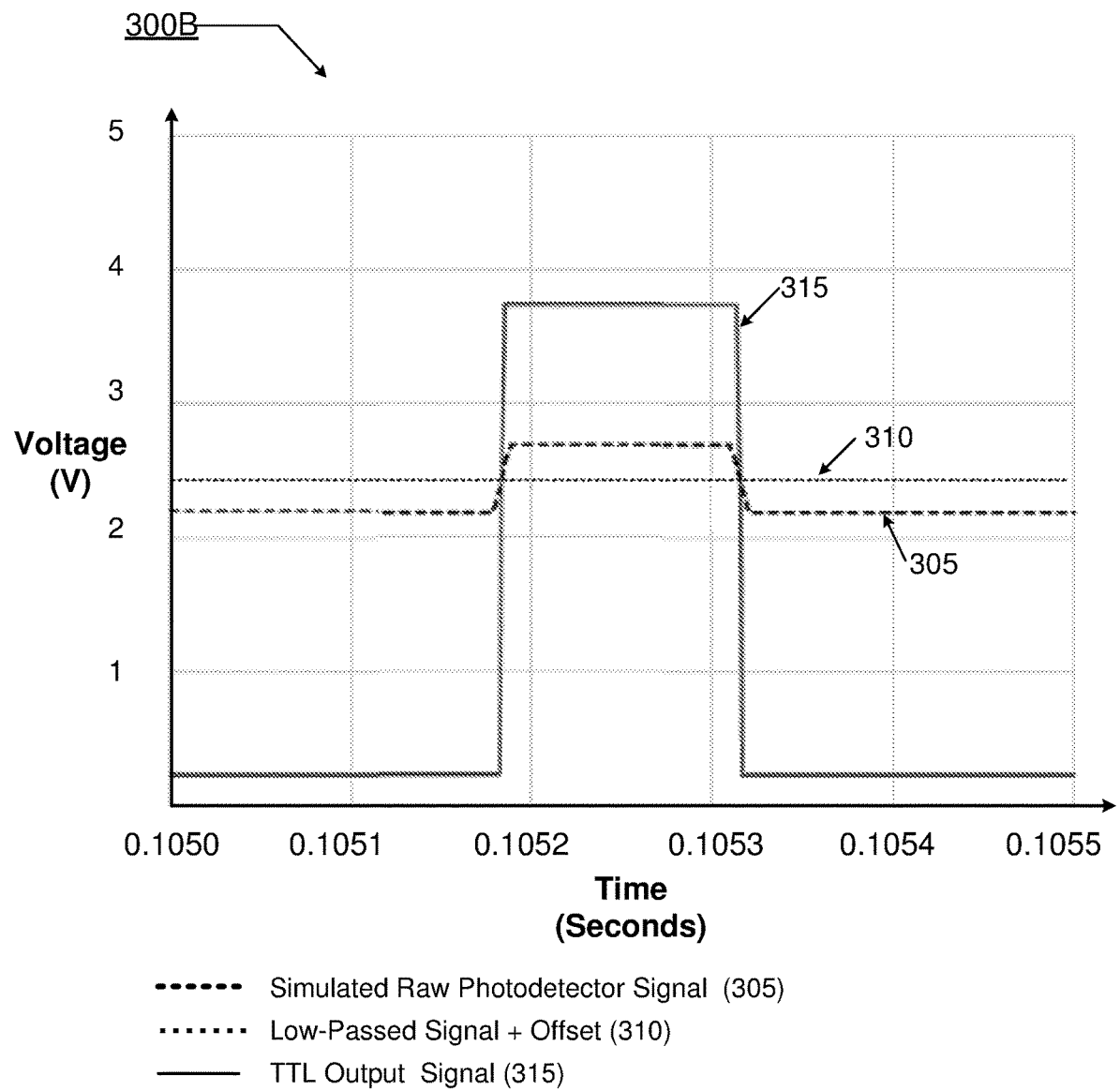

FIGS. 3A and 3B depict waveforms representing an example detection response of a slope change detection unit, according to an embodiment. In FIG. 3A (embodiment 300A), a simulated raw photodetector voltage signal (305) is represented as a dashed line, the filtered and offset voltage signal (310) is represented as a dotted line, and the output TTL signal 315 is represented as a solid line. The vertical axis is graduated in volts and the horizontal axis is graduated in time (in seconds). As shown, the detected luminescence of a plasma oscillates as a sine wave having an amplitude of about 0.2 V. In the example of FIG. 3B, a detail view of a portion of FIG. 3A is depicted. Here, an anomalous plasma event has occurred and the filtered signal remains constant because the high frequency arc signal has been filtered out. However, the anomalous plasma event, which in this case may correspond to an arc, has resulted in a change to the photodetector voltage signal. In this instance, the change to the photodetector output voltage signal corresponds to an increase in the slope of the photodetector output voltage signal. In response to the comparison between the simulated raw photodetector signal 305 and the filtered output signal 310 being offset from each other by a first threshold, (e.g., about 0 volt in FIG. 3B), high speed comparator causes an output TTL signal 315 to change from about 0.2V to about 3.8V. As further shown in FIG. 3B (embodiment 300B), responsive to the anomalous plasma event occurring (e.g. an arc), the simulated raw photodetector voltage signal 305 changes again (e.g., decreasing in slope). Responsive to simulated raw photodetector 305 signal decreasing in slope, such that the simulated raw photodetector signal 305 and the low-passed signal 310 are no longer offset from each other by a value greater than the first threshold, then high speed comparator causes an output TTL signal 315 to change from about 3.8V back to about 0.2V.

Figure 4:
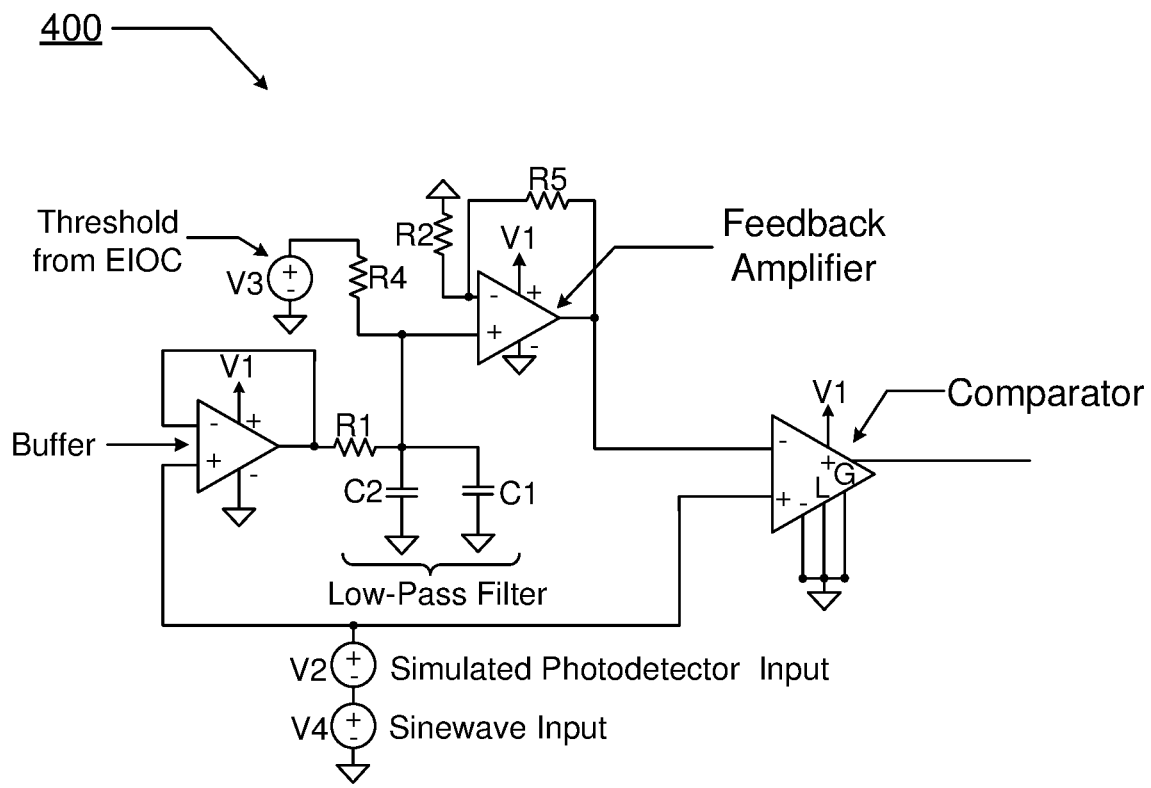
FIG. 4 depicts a schematic of an example electrical circuit capable of detecting an anomalous plasma event.

FIG. 4 depicts an example electrical circuit capable of detecting an anomalous plasma event, according to an embodiment 400. This circuit of embodiment 400 may represent aspects of the signal processor 108 of FIG. 1 and the first example slope change detection unit 214 of FIG. 2. In the embodiment of FIG. 4, the "Simulated Photodetector Input" may represent an optical voltage signal generated by the photodetector 112 of FIG. 2. Additionally, "Threshold from EIOC" ($V_3$) of FIG. 4 may represent Threshold/Monitor enable signal 222, which may be transmitted from an ethernet input output controller (EIOC) as part of a control program executed by system controller 950 of FIG. 9. Further, "Buffer" of FIG. 4 may represent buffer amplifier 216 of FIG. 2. The feedback amplifier 220 (depicted as "Feedback Amplifier" in FIG. 4) adds (or sums) the threshold from EIOC ($V_3$) signal to the output signal from the buffer of FIG. 4. The output signal from the buffer of FIG. 4 is filtered via the combination of R1/C1/C2, which forms a low-pass filter that corresponds to low-pass filter 218 of FIG. 2. Output signals from the buffer of FIG. 4 are compared to the combined simulated photodetector input ($V_2$) and sinewave input ($V_4$) signals via the comparator of FIG. 4 (corresponding to comparator 224 of FIG. 2). Responsive to the comparison of the aggregate of the combined simulated photodetector input and sine wave input with output signals from the feedback amplifier, the comparator of FIG. 4 detects an anomalous plasma event. In particular embodiments, the magnitude of the aggregate of the combined simulated photodetector input and the sine wave being greater than the output signals from the feedback amplifier, by a threshold amount, gives rise to detection of anomalous plasma event.

Although the functionality of the slope change detection unit of FIG. 2 may be implemented utilizing the analog electronic circuitry of FIG. 4, in some other implementations, the functionality of FIG. 2 may be implemented digitally, such as by way of a field-programmable gate array (FPGA). In some other implementations, the slope change detection unit may use a differentiator, which may operate to take a derivative of a raw optical data signal, such as an optical data signal from photodetector 112, to determine whether a change in the slope of an output signal from a photodetector has occurred. An output signal from a differentiator may be proportional to the rate of change (e.g., a derivative with respect to time) of an input signal voltage. A derivative of the raw optical data signal, such as from a photodetector, can be conveyed to an input port of a comparator, such as the high-speed comparator 224. A high-speed comparator may bring about a comparison between raw optical data signals and a threshold so as to determine whether the difference between the slope of a raw optical data signal exceeds a threshold. In some instances, the threshold sensitivity can be adjusted depending on process changes during deposition to avoid false alarming. If the change has exceeded the change threshold, then comparator 224 may again output a TTL signal at a second voltage having an increased magnitude with respect to a first voltage.

In some implementations, the slope change detection unit may use a fast Fourier transform (FFT) to convert the raw optical voltage signal to a frequency domain. Signals represented in a frequency domain may be utilized to determine whether certain frequency components, such as those associated with arcing (or other anomalous plasma events), are present with intensities greater than a particular threshold amount. In some implementations, if an unexpected frequency is detected (or detected at a level that exceeds a threshold) in response to the occurrence of an anomalous plasma event, an output signal may be generated.

Responsive to detection of an anomalous plasma event, such as by way of generation of a TTL signal, various responses and actions may be taken, such as adjusting RF power coupled to a fabrication chamber. In some instances, adjustments may include decreasing (or discontinuing completely) the RF power (e.g., LF, HF, or both). In some such instances, after the magnitude of the RF power has been decreased to 0, the RF power may be increased to a previous level after some period of time sufficient to allow the arcing (or other anomalous plasma event within a fabrication chamber) to come to a stop. Such increasing of RF power may correspond to a linear or non-linear increase. In some other instances, the adjusting of the RF power may include decreasing the RF power (e.g., LF, HF, or both) to a non-zero level for a period of time, and then increasing the power to a level that corresponds to the original level.

Figure 5:
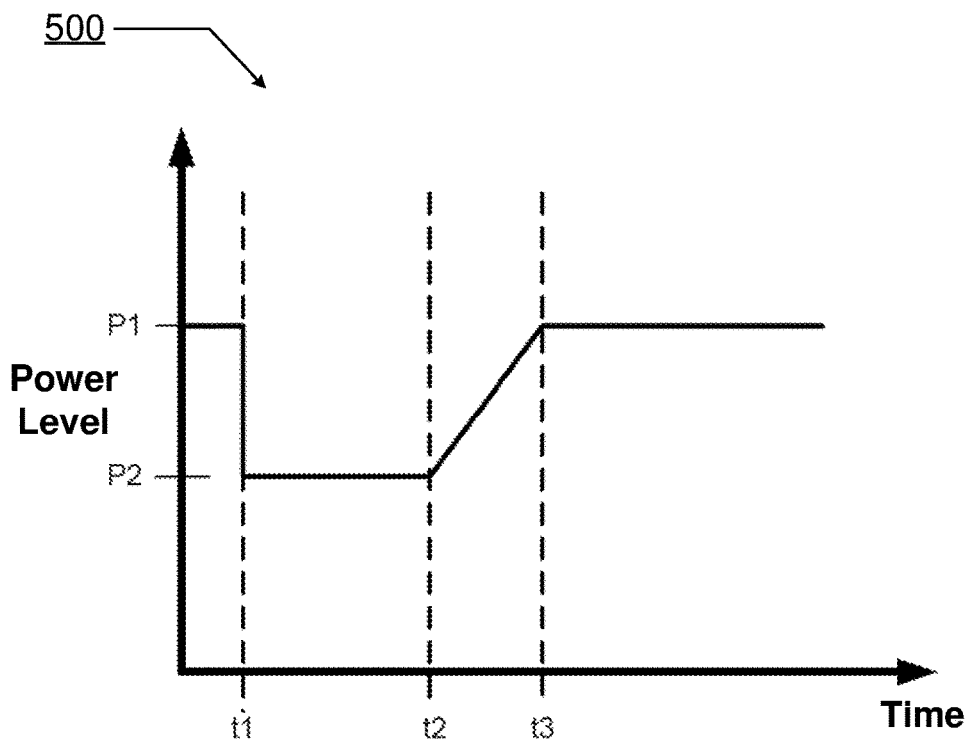
FIG. 5 shows a waveform that represents RF power coupled to a process station of a fabrication chamber as a function of time.

FIG. 5 shows a waveform 500 that represents RF power coupled to a process station of a chamber as a function of time. As shown in FIG. 5, time t1 the RF power (e.g., power supplied by RF generator 110 of FIG. 1) corresponds to a power level P1. At time t1, in response to detection of an anomalous plasma event, the RF power is lowered to power level P2 and maintained for a period of time from t1 to time t2. At time t2, the RF power is gradually increased (e.g., ramped) between time t2 and t3 until the RF output power attains a level P1. In some embodiments, the RF Power reduction may be a percentage reduction, such as a reduction of 10% or 30%, for example. However it will be understood that the disclosed implementations are not limited to such examples and are intended to embrace RF power reductions of any percentage, such as 5%, 10%, 20%, 30%, and so forth.

In some implementations, a determination may be made as to a magnitude of the detected anomalous plasma event, e.g., by determining the intensity of an anomalous plasma event via subtracting a low-pass filtered data point of the photodetector signal from a corresponding unfiltered data point. A subtraction of a low-pass-filtered data point from a corresponding unfiltered data point may bring about an estimate of, for example, arc light intensity. Such a determination (or other determinations that may provide some indication of the intensity of an anomalous plasma event) may, in such implementations, be used to determine the degree of RF system adjustment responsive to the anomalous plasma event. For example, if a detected anomalous plasma event is of a decreased magnitude, then the system may cause the RF generator(s) to switch to a lower power mode at a first level. However if the magnitude of the detected RF event attains a certain threshold magnitude, then the system may cause the RF generator(s) to switch to another lower power mode that is at a second level lower than the first level. There may, in such systems, be multiple power levels supported, in which supported power levels may correspond to a different threshold magnitude of anomalous plasma event intensity. In these instances, the system may select the power level that is associated with the range of arc intensity magnitudes within which the detected arc event falls.

Figure 6A:
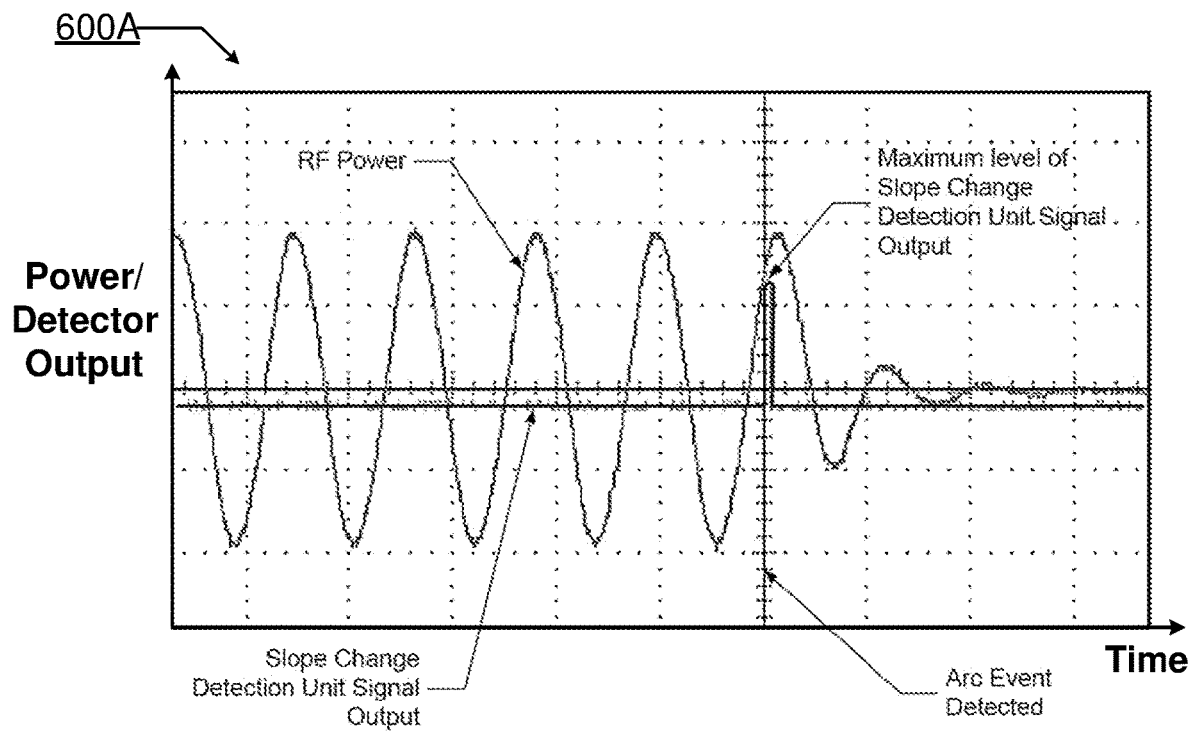
FIG. 6A shows another waveform that represents RF power output along with the signal output of a slope change detection unit.

FIG. 6A shows another waveform that represents RF power along with an output signal of a slope change detection unit according to an embodiment 600A. As shown, the RF power output of the RF generator oscillates and the output signal of the slope change detection unit corresponds to a relatively flat constant line. At a detected anomalous plasma event, the amplitude of the output signal of the slope change detection unit increases and the RF power unit interrupts the RF power output signal. In some instances, the response time between the slope change detection unit signal increase and an adjustment in RF power output may correspond to about 2 microseconds.

In some embodiments in which anomalous plasma events (e.g., formation of an electrical arc) occur above or below an edge portion of a semiconductor wafer, arc intensity and process parameters can define an amount by which RF power should be decreased. For example, in some embodiments a high RF power brings about a more dispersive RF plasma. Accordingly, lowering RF power coupled to a process station may operate to confine the plasma to a region between the electrodes. For example, responsive to occurrence of an electrical arc at an edge portion of a semiconductor wafer, decreasing the RF power may reduce the plasma density on the wafer edges and thus concentrate the generated plasma to a region between the electrodes and more towards the center of the wafer. Lowering the RF power may also operate to lower the voltage at the electrode, which, in turn, assists in diminishing the occurrence of anomalous plasma events (e.g., arcing) events even if such events occur toward the center of the wafer (away from edge portions). Intensity of anomalous plasma events and process parameters can also be used to define an amount by which RF power is to be lowered. For example, the greater the arc intensity, greater the decrease in RF power. Additionally, for a very low-pressure process, the plasma may be dispersive than compared with a high-pressure process (for same power, gases, and other parameters). Thus, in such cases, power may need to be lowered more so as to bring about greater confinement of plasma.

Anomalous plasma event detection equipment, such as the apparatus described above, may be arranged in alternative configurations. More specifically, the signal processor 108 may be located in different positions and may include different configurations. As stated above, in FIG. 1, the signal processor may be positioned at a location different than inside the processing chamber, such as in a different portion of the tool. In some implementations, optical signals may be transmitted from a location within the processing chamber 102 to the photodetector of the signal processor, such as via a fiber optic cable 106.

Figure 6B:
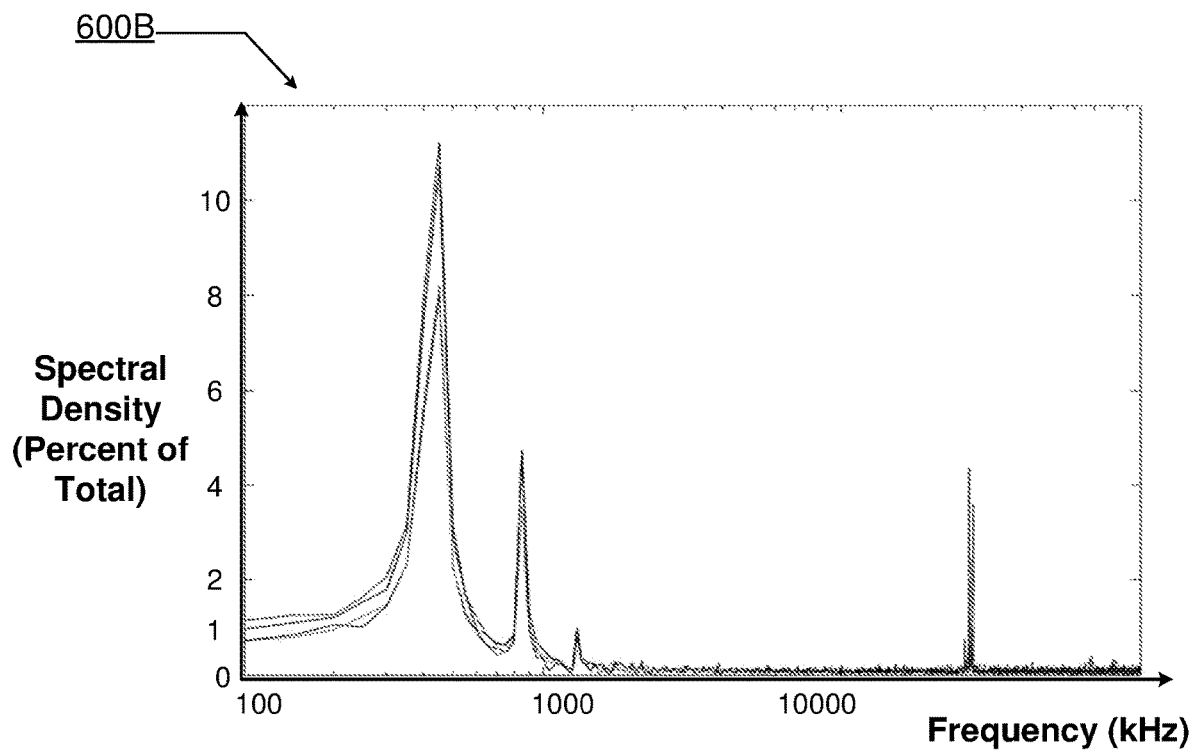
FIG. 6B depicts a group of profiles that represent the spectral density of optical energy fluctuations under nominal operating conditions within a process station.

FIG. 6B depicts a group of profiles 600B that represent a spectral density of optical energy fluctuations under nominal operating conditions within a process station, according to an embodiment. The vertical axis of FIG. 6B indicates a measure of spectral density (e.g., a percentage of total spectrum) while the logarithmically-graduated horizontal axis of FIG. 6B indicates frequency. Thus, a profile of the group of profiles 600B represents a spectral density of optical energy fluctuations over a predetermined time period in response to RF power coupled at frequencies of about 400 kHz (i.e., ±10%) and about 13.56 MHz (i.e., ±10%) In the particular example of FIG. 6B, the spectral density of optical energy fluctuation is shown over four sampling periods, in which each profile represents a spectral density of optical energy fluctuation over one of the four sampling periods. Accordingly, responsive to coupling of RF power (e.g., including frequencies of 400 kHz and 13.56 MHz) to a fabrication chamber, an optical signal from a plasma may fluctuate or oscillate at a first peak corresponding to a 400 kHz base frequency (±10%), as well as fluctuating or oscillating at harmonics of 400 kHz, such as at about 800 kHz (±10%) and 1600 kHz (±10%). Additionally, it may be appreciated that the spectral density of a fluctuating optical signal from a plasma varies by only small amounts at frequencies of between about 100 kHz and about 50 MHz. For example, at a frequency of about 100 kHz, a spectral density of an optical signal generated by a plasma may range from about 0.8% to about 1.2% of the total spectrum of a fluctuating optical signal from a plasma.

Figure 6C:
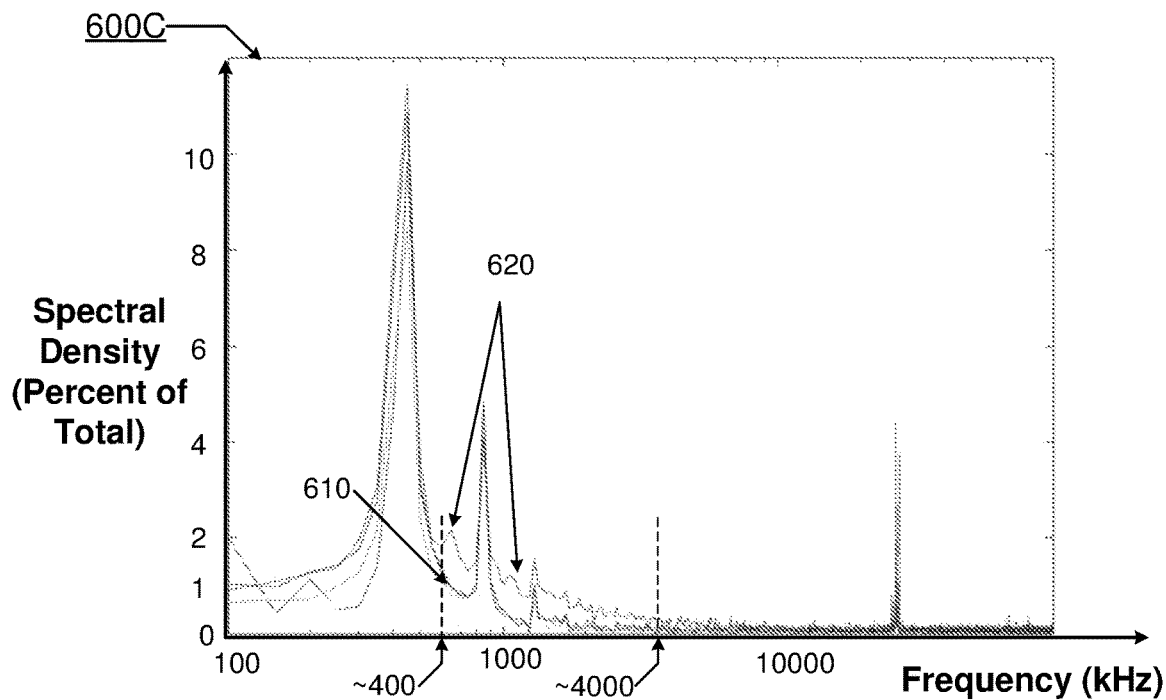
FIG. 6C depicts a group of profiles that represent the spectral density of optical energy fluctuations under nominal operating conditions within a process station as well as a profile representing spectral density of optical energy fluctuations while an anomalous plasma event occurs within a process station.

FIG. 6C depicts a group of profiles that represent a spectral density of optical energy fluctuations under nominal operating conditions within a process station as well as a profile representing the spectral density of optical energy fluctuations while an anomalous plasma event occurs within a process station, according to an embodiment 600C. Similar to that of FIG. 6B, the vertical axis of FIG. 6C indicates a measure of a spectral density (e.g., percentage of total optical energy) while the logarithmically-graduated horizontal axis of FIG. 6C indicates frequency. A profile of the group of profiles 610 represents a spectral density of optical energy of a fluctuating plasma over a predetermined time period in response to coupling of RF power (e.g., 400 kHz and 13.56 MHz) to a fabrication chamber. In the particular example of FIG. 6C, the spectral density of optical energy fluctuations is shown over three sampling periods, each corresponding to one of profiles 610.

Responsive to coupling of RF power to a fabrication chamber (e.g., 400 kHz and 13.5 MHz), an optical signal generated by a plasma may fluctuate or oscillate at a first peak frequency corresponding to a 400 kHz base frequency. The optical signal generated by the plasma may additionally fluctuate or oscillate at harmonics, such as at about 800 kHz and (1600 kHz) 1.6 MHz. Additionally, it may be appreciated that the spectral density of each of profiles 610 varies by only small amounts at frequencies of between about 100 kHz and about 50 MHz.

However, in addition to profiles 610, FIG. 6C additionally depicts profile 620, which represents spectral density of optical energy fluctuation responsive to an anomalous plasma event (e.g., an arc) occurring within a fabrication chamber. Thus, as shown in FIG. 6C, during an anomalous plasma event, the spectral density of optical energy fluctuations is noticeably increased between about 600 kHz and about 3.6 MHz. In other embodiments, during an anomalous plasma event, the spectral density of optical energy fluctuation may be noticeably increased at different frequency ranges, such as between about 400 kHz (±10%) and about 4 MHz (±10%). For example, at about 1 MHz (1000 kHz) the spectral density of profile 620, which may be observed during an anomalous plasma event within the chamber, corresponds to a value of about 2%. This may be compared with the spectral density observed under nominal conditions, such as indicated by profile 610, which corresponds to a value of about 1%. Thus, as shown in FIG. 6C, an anomalous plasma event (e.g., as evidenced by profile 620) may be indicated by observing a significant increase in spectral density of plasma fluctuations between particular frequency ranges.

In the particular example of FIG. 6C, an anomalous plasma event is indicated via observing or detecting an increase in spectral density of about 100%, at a particular frequency or over a particular range of frequencies, in relation to nominal plasma conditions of a fabrication chamber over the particular frequency or range of frequencies (e.g., from a spectral density of about 1% to a spectral density of about 2%). Additionally, such increases in spectral density may be observed at frequencies of between about 400 kHz (±10%) and 4 MHz (±10%), although it will be understood that the disclosed implementations are not limited to such examples and may embrace spectral densities and/or spectral density profiles observed at other frequency ranges, such as frequencies below about 400 kHz as well as frequencies above about 4 MHz. In addition, in other implementations, anomalous plasma events can be indicated by smaller increases in a spectral density of a fluctuating or oscillating signal from plasma relative to nominal operating conditions. For example, in particular implementations, an anomalous plasma event may be identified in response to an increase in spectral density of less than 100%, such as 75%, 50%, and so forth, and the disclosed implementations are not limited such examples and may embrace other increases in spectral density.

In certain implementations, an anomalous plasma event may be identified in response to an increase in spectral density with respect to standard deviations of spectral densities observed under nominal operating conditions. Thus, in an example, an anomalous plasma event may be identified by first computing a standard deviation in spectral density for a group of profiles, such as profiles 610, that represent nominal (or reference) plasma conditions. In another example, a moving average (along with a moving standard deviation) can be computed over a particular duration. In another example a standard deviation may be computed continuously using a time window that expands in size as a function of time. Methodologies for computing standard deviations, or other statistical measures, may depend on the particular process being performed at a process station and may change during processing of a wafer.

In response to computing a standard deviation utilizing a reference spectral density, an anomalous plasma event may be identified responsive to observing a fluctuating signal from a plasma characterized by spectral density profile having an amplitude that is (for example) one standard deviation greater than the computed standard deviation (e.g., a standard deviation utilizing a reference in spectral density). In another example, an anomalous plasma event may be identified responsive to observing a spectral density profile having an amplitude that is two standard deviations greater than the computed standard deviation (e.g., a standard deviation utilizing a reference spectral density). However, the disclosed implementations are intended embrace spectral density profiles indicating an anomalous plasma events that differs by any number of standard deviations with respect to a spectral density profiles of a fluctuating signal from a plasma operating under nominal conditions.

Returning briefly to FIG. 1, in particular embodiments, signal processor 108 may be programmed to perform analysis on raw output signals from photodetector 112. In one or more of such embodiments, analysis of output signals from photodetector 112 may be utilized to determine spectral density of optical energy fluctuations under various operating conditions within a process station. Thus, with reference to FIG. 6C, profiles representing plasma energy fluctuations over predetermined time periods may be analyzed to determine spectral density at various frequencies as a fraction or percentage of total spectrum of optical energy fluctuations of a plasma source. In some instances, such analysis performed by signal processor 108 may involve performing a fast Fourier transform (FFT) on an output signal from photodetector 112. Following performance of a FFT on output signals from photodetector 112 over one or more predetermined time periods, the spectral density of optical energy fluctuations may be plotted in a manner similar to that of FIG. 6B/6C. Responsive to analysis of the spectral density of optical energy fluctuations, signal processor 108 may determine that an anomalous plasma event has occurred. In particular embodiments, an anomalous plasma event may be identified in response to detecting an increase in spectral density at particular frequencies of optical energy fluctuations, such as between about 400 kHz and about 4 MHz. An anomalous plasma event may be identified in response to observing a spectral density having an amplitude that is greater than a threshold amount relative to a spectral density observed during nominal plasma conditions. In particular embodiments, the threshold amount may correspond, for example, to one or two standard deviations referenced to spectral densities computed during nominal plasma conditions. Anomalous plasma events may be identified in response to observing a spectral density having amplitudes other than one or two standard deviations, referenced to spectral densities computed during nominal plasma conditions, and the disclosed implementations are not limited to such examples. In addition, anomalous plasma events may be identified by detecting increases in spectral density at frequencies other than between about 400 kHz and about 4 MHz, and disclosed implementations are not limited to such examples. Rather, implementations are intended to embrace detection of spectral density over any range of oscillations or fluctuations of optical energy of a plasma.

Figure 6D:
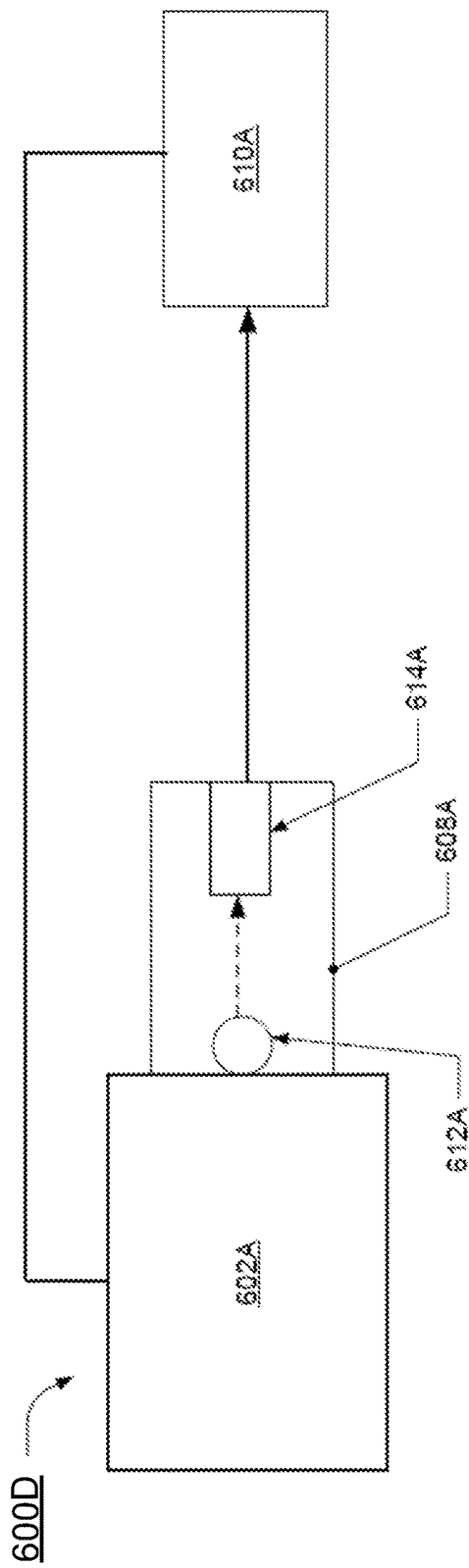
FIGS. 6D and 6E depict alternative configurations of the first example anomalous plasma event detection apparatus of FIG. 1.
Figure 6E:
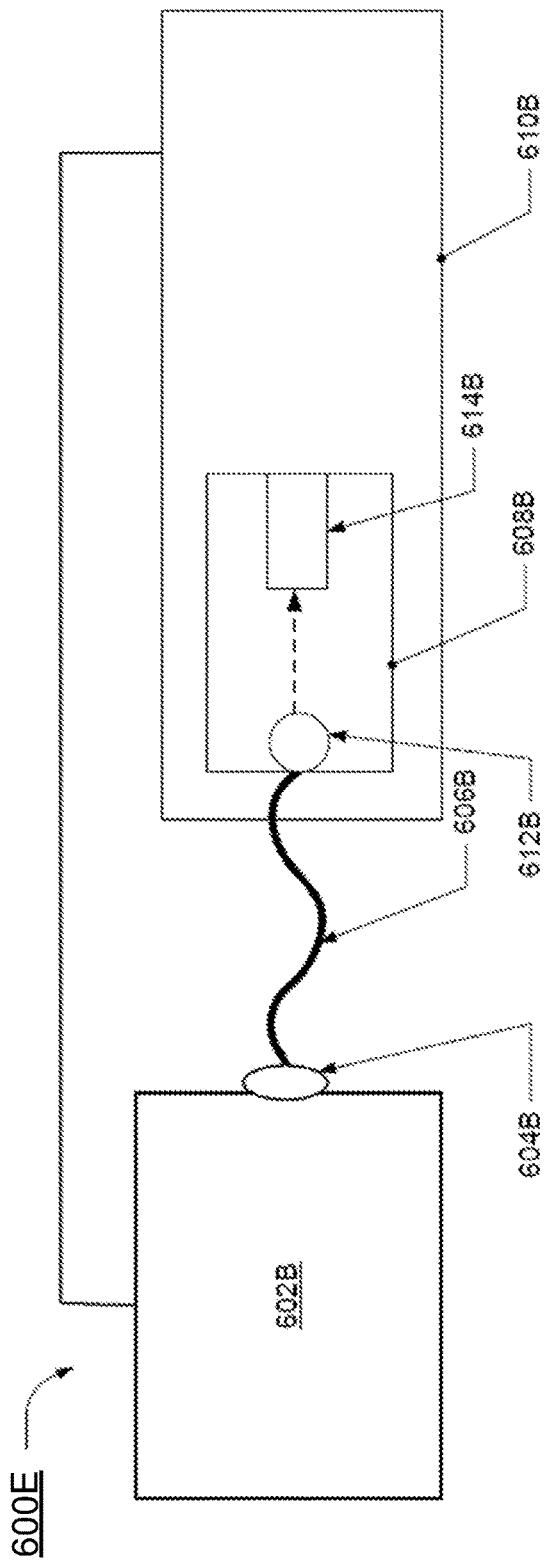

FIGS. 6D and 6E depict alternative configurations of the first example anomalous plasma event detection apparatus of FIG. 1. In FIG. 6D, the anomalous plasma event detection apparatus 600D may not include a fiber optic cable. Rather, the anomalous plasma event detection apparatus 600D may include the signal processing unit 608A positioned at or on the processing chamber 602A, such that the photodetector obtains the optical signal of the plasma at the processing chamber 602A. Output signals from photodetector 612A may be processed utilizing high-speed comparator 614A. The output signal from a high-speed comparator 614A is then transmitted to the RF generator 610A. In some embodiments, the apparatus may include a lens 604 between the processing chamber 602A and the photodetector 612A. In FIG. 6E, the anomalous plasma event detection apparatus 600E includes a lens 604B, coupled via a fiber optic cable 606B to signal processing unit 608B as part of the RF generator 610B. In such instances, photodetector 612B may also be a component of RF generator 610B. In some such instances, the RF generator 610A may include a high-speed comparator 614B, such that an additional high-speed comparator is not utilized. An advantage of the anomalous plasma event detection apparatus 600E is that noise around the processing chamber 602B and the signal processing unit 608B may not affect the signals utilized and generated by the signal processing unit 608B.

Figure 7A:
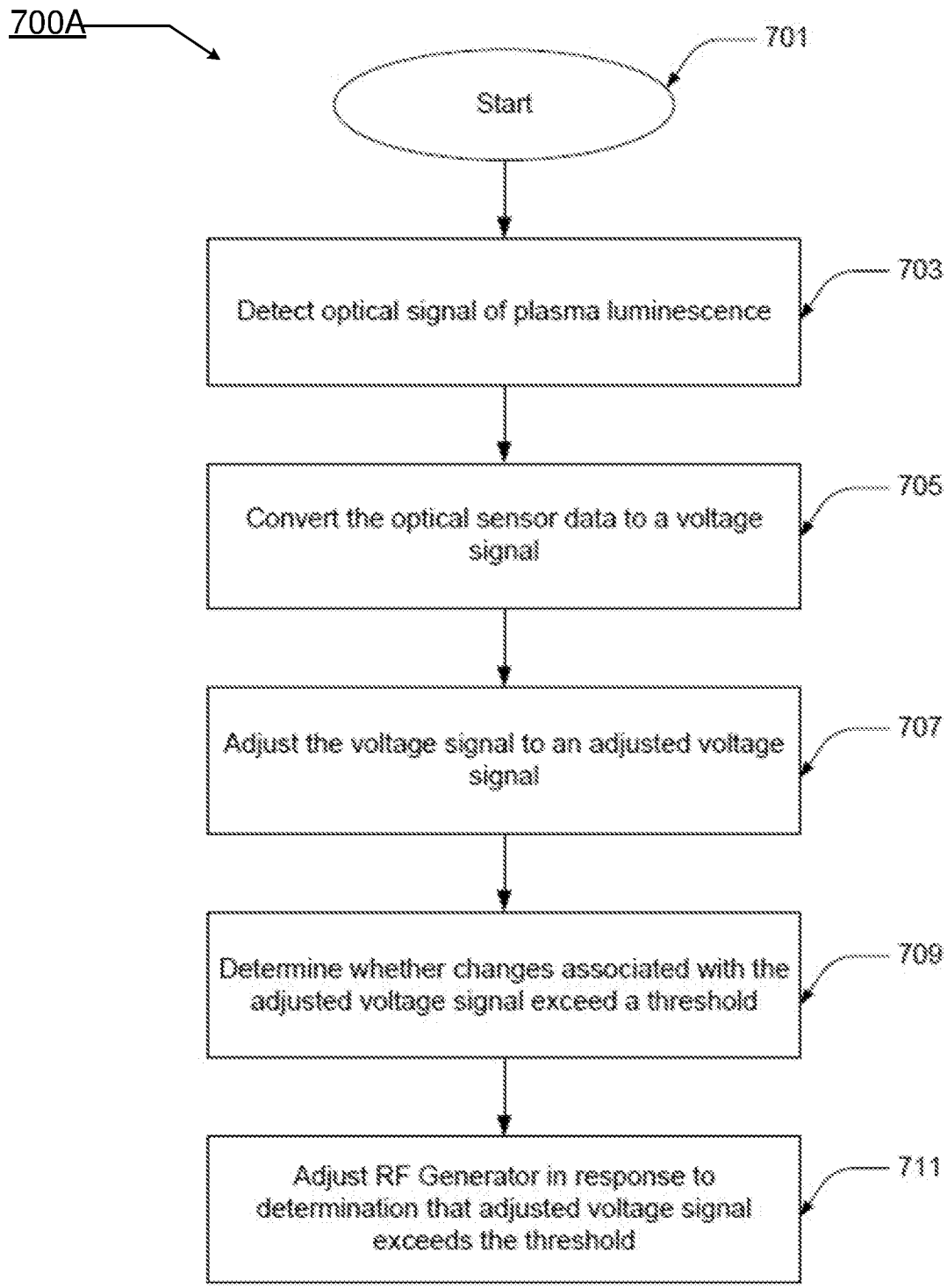
FIG. 7A depicts a flowchart for a first example technique of detecting, and mitigating effects of, an anomalous plasma event.

Various techniques may also be used to detect and mitigate arc events within a processing chamber. FIG. 7A depicts a flowchart for a first example technique of detecting, and mitigating effects of, an anomalous plasma event, according to an embodiment 700A. The technique begins at 701 and in 703 the optical signal generated by the fluctuating luminescence of a plasma is detected. As stated above, the plasma emits various wavelengths of light and an optical sensor or photodetector, such as the photodetector 112, is configured to detect the light emitted by the plasma. Additionally, in 705, that optical signal is converted to a voltage signal and this conversion may be performed by the optical sensor or photodetector. In 707, the voltage signal is adjusted to form an adjusted voltage signal. This adjustment may be in accordance with any of the techniques described above, such as filtering and/or offsetting the raw optical voltage signal as described with respect to FIG. 2, taking the derivative of the raw optical voltage signal, or using an FFT analysis of the raw optical voltage signal.

In response to the raw optical voltage signal being adjusted, 709 determines whether changes that are associated with the adjusted voltage signal exceed a threshold. The determination may be any of the comparisons described above, such as comparing the filtered and/or offset voltage signal (i.e., the adjusted voltage signal) with the raw optical voltage signal to determine whether any changes between these two signals exceed the threshold. As stated above, in some embodiments, the determination is made as to whether the changes between these two signals exceed the threshold, which, in turn, may indicate an arc or other type of anomalous plasma event occurring within processing chamber. The determination in these embodiments (i.e., embodiments utilizing a filtered optical signal) is not based solely on the changes of the filtered and/or offset signal itself, but rather based on the changes of raw voltage signal with respect to the filtered and/or offset signal. For example, as shown in FIG. 3B, it is the change of the raw voltage signal with respect to the filtered signal that indicates occurrence of an arc or other type of anomalous plasma event. Responsive to utilizing both signals, this comparison is still a determination that is associated with the adjusted voltage signal. The threshold may be chosen according to various parameters, such as a rate of change and a magnitude of change, for example.

In some other embodiments of 709, determining that an anomalous plasma event is occurring may be based on the changes of the adjusted voltage signal with respect to a threshold, such as utilizing a derivative and/or a FFT method. Here, the determination may be based on the changes of the adjusted voltage signal. For example, the output signal of the derivative technique may involve a direct correlation to the rate of change of the optical signal such that the determination of this adjusted voltage signal can directly indicate an arc occurrence.

In 711, if the determination is made that the changes associated with the adjusted the voltage signal exceed the threshold, then mitigation actions may be taken. These mitigation actions may include, as described above, adjusting output parameters of an RF generator, such as by reducing the RF power output to a lower power level for a period of time and then ramping the RF power output back to an initial power level.

Although not depicted in FIG. 7A, as stated above, the technique may also include indicating that the determination of 709 causes a TTL signal to be generated and sent to the RF generator. In some embodiments, the RF generator is configured to receive the TTL signal and cause a response to one or more parameters of the RF generator, such as reducing the output power of the RF generator. An additional aspect of the technique may also include, before or contemporaneously with 703, generating a plasma in the processing chamber by coupling RF power to the processing chamber.

Figure 7B:
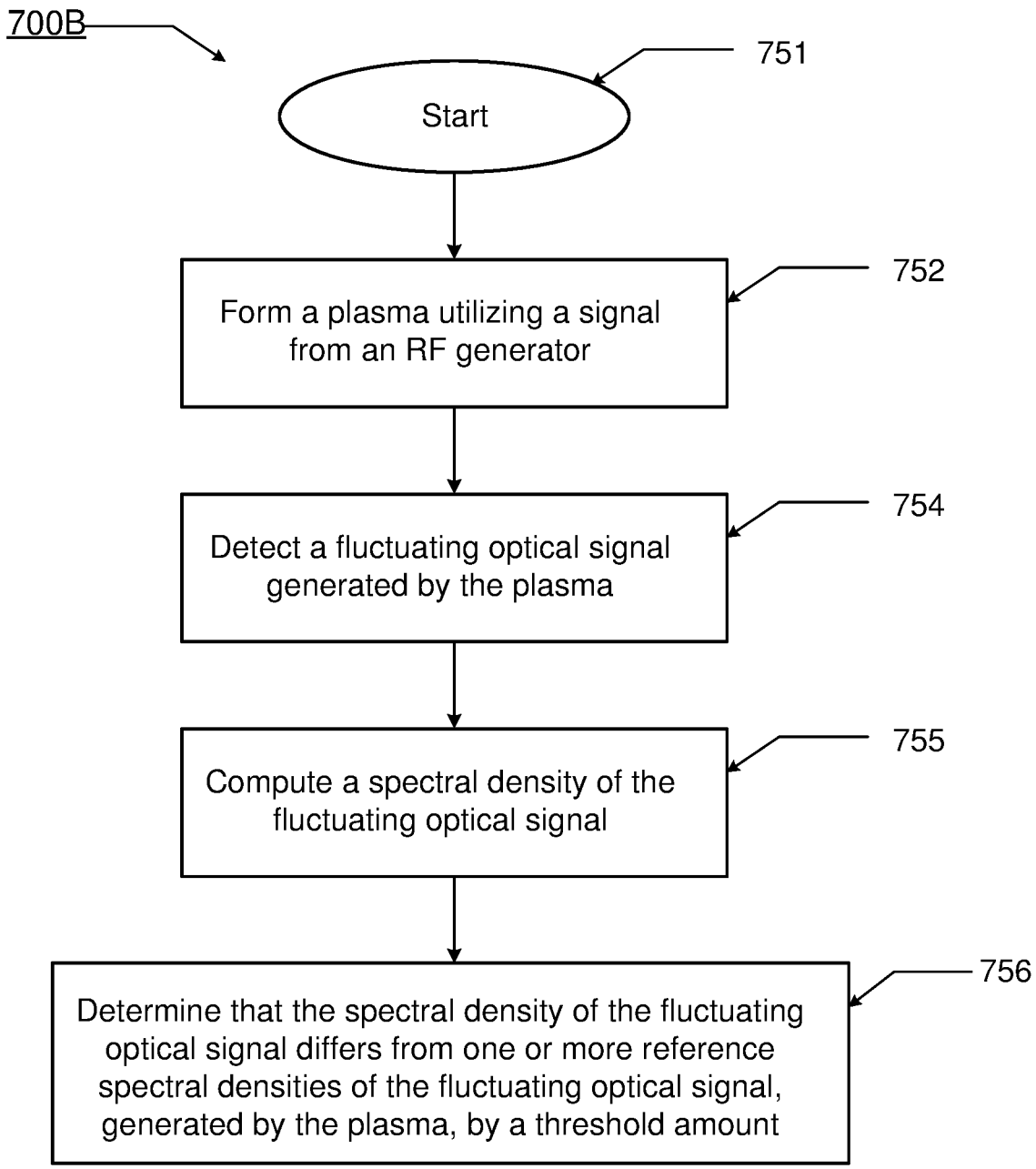
FIG. 7B depicts a flowchart for a second example technique of detecting, and mitigating effects of, an anomalous plasma event.

FIG. 7B depicts a flowchart for a second example technique of detecting, and mitigating effects of, an anomalous plasma event, according to an embodiment 700A. The technique begins at 751 and in 752, a plasma is formed in response to a signal of sufficient amplitude from an RF generator. In some embodiments, an RF generator may generate signals of about 400 kHz (±10%) and about 13.56 MHz (±10%), for example. It will be understood that the disclosed implementations are not limited to such examples and may embrace a variety of additional frequencies. At 754, a fluctuating optical signal generated by the plasma may be detected. Detection may be carried out by an optical sensor or photodetector. At 755, a signal processor may compute a spectral density of a fluctuating optical signal. In particular embodiments, such computing may occur while plasma operates under nominal conditions, and may occur over several time periods. In particular embodiments, at 756, a determination may be made that the spectral density of the fluctuating optical signal differs from one or more previously computed spectral densities of the fluctuating optical signal. However, in certain other embodiments, 756 may involve determining that the spectral density of the fluctuating optical signal differs from a reference spectral density. Responsive to the spectral density of the fluctuating optical signal differing, perhaps by threshold amount, from previously computed spectral densities or from any other type of reference spectral density, the signal processor may indicate that an anomalous plasma event has occurred.

In some embodiments, the semiconductor processing chamber may include two or more processing stations, as described below, and the luminescence of each station may be separately monitored. For example, a processing chamber may include four processing stations and each of those processing stations may utilize a separate photodetector configured to detect the optical from a corresponding processing station.

The apparatuses and techniques described herein provide for numerous advantages over conventional anomalous plasma event detection techniques. In some instances, these described techniques enable a faster detection time and mitigation response time because the optical signal may be processed with an analog circuit that can generate a signal directly to the RF generator, which can respond to that signal. This direct connection between the RF generator and the optical signal enables fast, efficient response time. In contrast, conventional techniques may require the detected signal to be sent to a processor to be analyzed and then another signal sent by the processor to the RF generator. Because certain anomalous plasma events, such as electrical arcs, can quickly form, the delay by some conventional techniques may bring about undesirable damage to the wafer and/or other equipment. Additionally, as described above, these described techniques and apparatuses are able to detect small-magnitude anomalous plasma events that cannot be detected by conventional methods.

As stated above, the apparatuses and techniques described herein are applicable to any semiconductor process that uses a plasma and to any semiconductor processing chamber in which the plasma is generated. Examples of these processes and apparatuses are discussed hereinbelow.

Plasma-Enhanced Chemical Vapor Deposition (PECVD) Apparatuses

In some embodiments, wafer fabrication equipment may include one or more PECVD process stations included in a process tool. The process tool may include the features described above in FIGS. 1, 6A, and 6B, for instance along with the other features described below.

Figure 8:
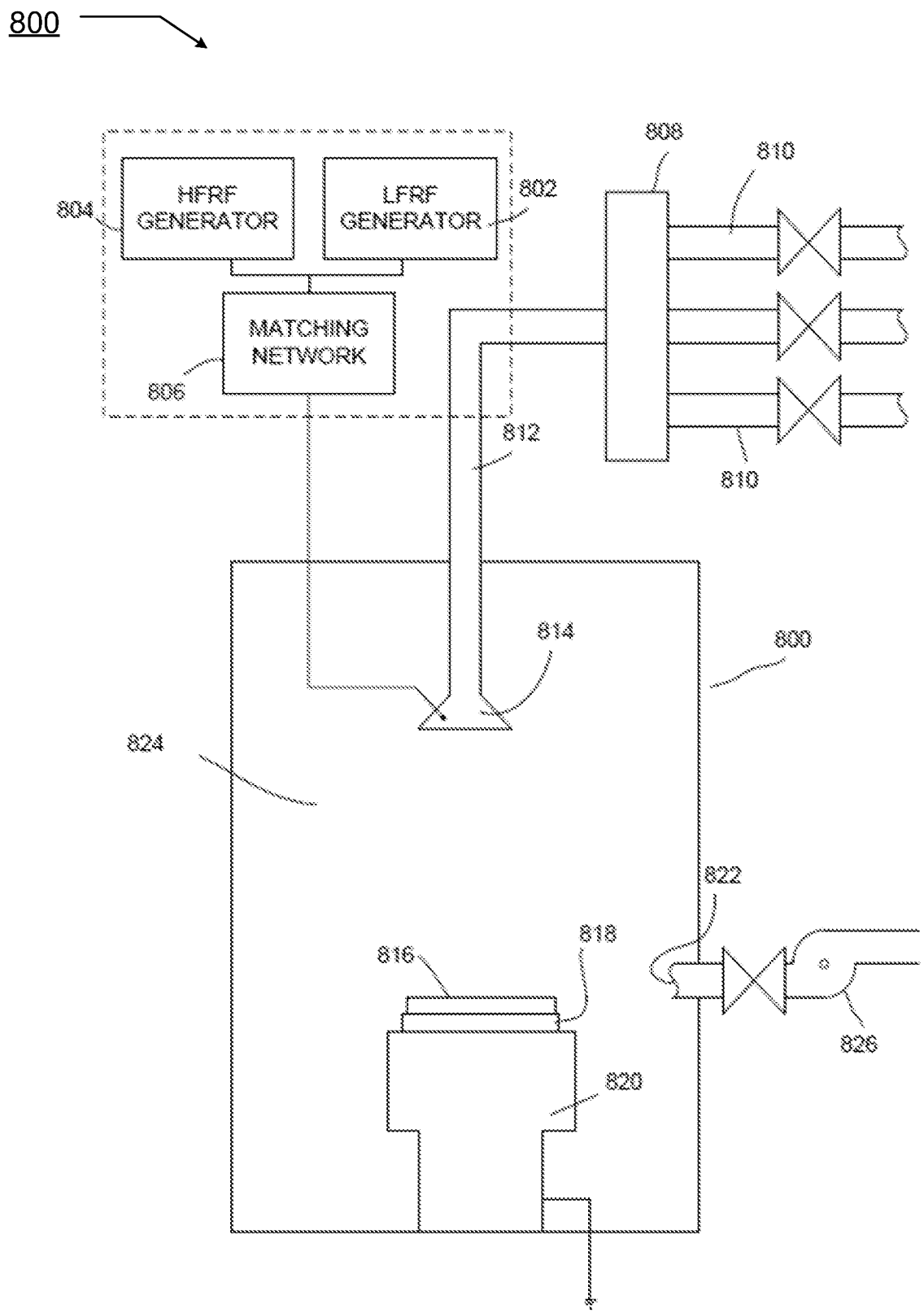
FIG. 8 provides a block diagram of an example apparatus that may be used to practice the disclosed embodiments.

FIG. 8 provides a block diagram of an example apparatus that may be used to practice the disclosed embodiments. As shown, a reactor 800 of FIG. 8 includes a process chamber 824, which encloses other components of the reactor and serves to contain the plasma generated by, e.g., a capacitor type system including a showerhead 814 working in conjunction with a grounded heater block 820. A high-frequency RF generator 802, connected to a matching network 806, and a low-frequency RF generator 804 are connected to showerhead 814. The power and frequency supplied by matching network 806 is sufficient to generate a plasma from the process gas, for example 400-700 W total energy. In one implementation of the present invention both the HFRF generator and the LFRF generator may be used during deposition, while is some other implementations just the HFRF generator of the LFRF generator is used. In a typical process, the high frequency RF component is generally between about 2-60 MHz; in at least one embodiment, the HF component is about 13.56 MHz. The low frequency LF component is generally between about 250-400 kHz. In some embodiments, the RF generator may be considered to have both the HFRF generator and the LFRF generator, and in some instances, the matching network.

Within the reactor, a wafer pedestal 818 supports a substrate 816. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 812. Multiple source gas lines 810 are connected to manifold 808. The gases may be premixed or not. Appropriate valving and mass flow control mechanisms are employed to ensure that the correct gases are delivered during the deposition and post-deposition phases of the process. In the case that the chemical precursor(s) are delivered in liquid form, liquid flow control mechanisms are employed. The liquid is then vaporized and mixed with other process gases during its transportation in a manifold heated above its vaporization point before reaching the deposition chamber.

Process gases exit chamber 824 via an outlet 822. A vacuum pump 826 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The invention may be implemented on a multi-station or single station tool. In specific embodiments, the 300 mm Novellus Vector™ tool having a 4-station deposition scheme or the 200 mm Sequel™ tool having a 6-station deposition scheme are used.

Figure 9:
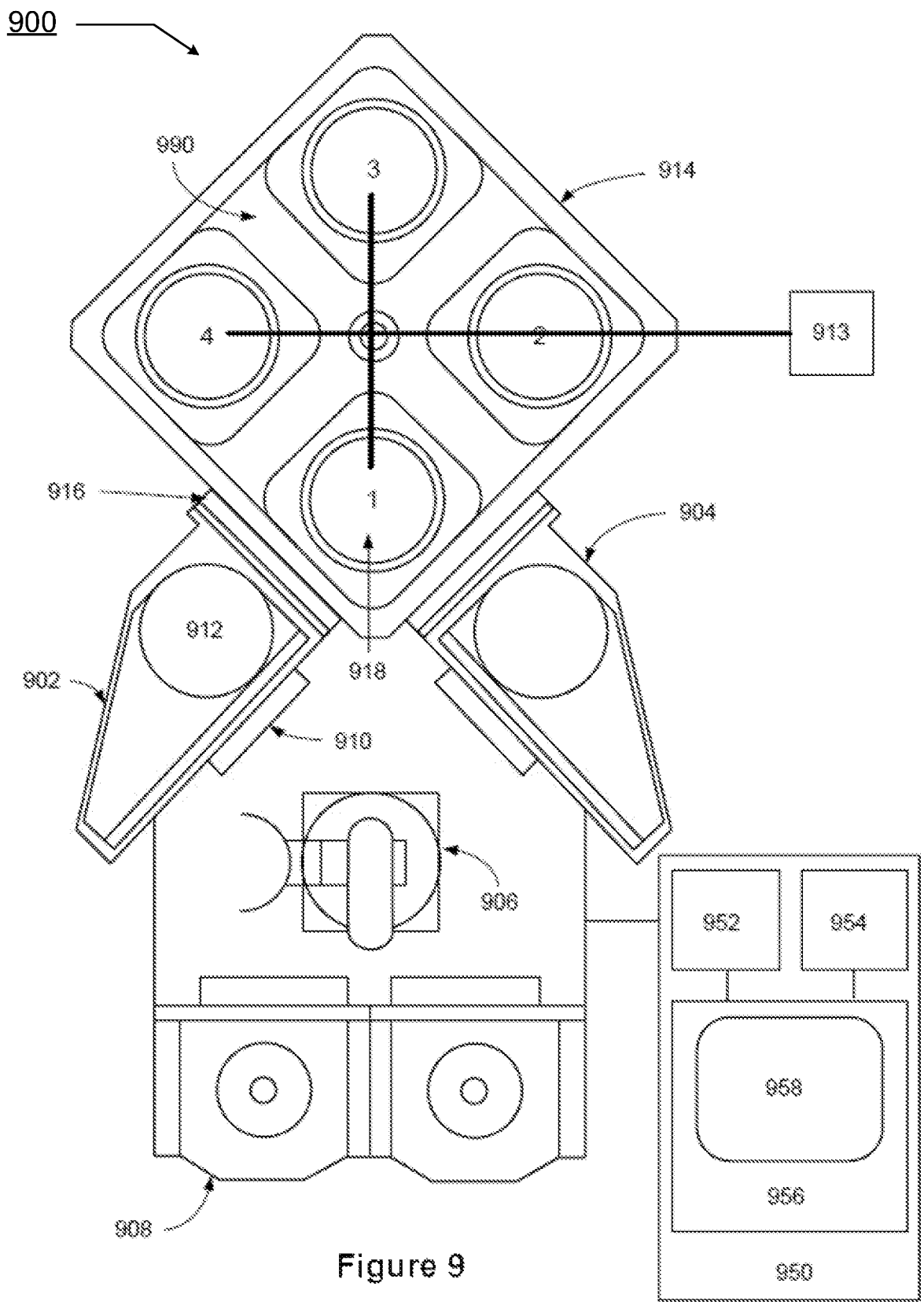
FIG. 9 shows a schematic view of an embodiment of a multi-station processing tool.

FIG. 9 shows a schematic view of an embodiment of a multi-station processing tool 900 with an inbound load lock 902 and an outbound load lock 904, either or both of which may utilize a remote plasma source, according to an embodiment 900. A robot 906, at atmospheric pressure, is configured to move wafers from a cassette loaded through a pod 908 into inbound load lock 902 via an atmospheric port 910. A wafer is placed by the robot 906 on a pedestal 912 in the inbound load lock 902, the atmospheric port 910 is closed, and the load lock is pumped down. Where the inbound load lock 902 utilizes a remote plasma source, the wafer may be exposed to a remote plasma treatment in the load lock prior to being introduced into a processing chamber 914. Further, the wafer also may be heated in the inbound load lock 902 as well, for example, to remove moisture and adsorbed gases. Next, a chamber transport port 916 to processing chamber 914 is opened, and another robot (not shown) places the wafer into the reactor on a pedestal of a first station shown in the reactor for processing. While the embodiment depicted in FIG. 9 includes load locks, it will be appreciated that, in some embodiments, direct entry of a wafer into a process station may be provided.

The depicted processing chamber 914 includes four process stations, numbered from 1 to 4 in the embodiment shown in FIG. 9. Each station has a heated pedestal (shown at 918 for station 1) and gas line inlets. It will be appreciated that in some embodiments, each process station may have different or multiple purposes. While the depicted processing chamber 914 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 9 also depicts an embodiment of a wafer handling system 990 for transferring wafers within processing chamber 914. In some embodiments, wafer handling system 990 may transfer wafers between various process stations and/or between a process station and a load lock. It will be appreciated that any suitable wafer handling system may be employed. Non-limiting examples include wafer carousels and wafer handling robots. FIG. 9 also depicts an embodiment of a system controller 950 employed to control process conditions and hardware states of process tool 900. System controller 950 may include one or more memory devices 956, one or more mass storage devices 954, and one or more processors 952. Processor 952 may include a CPU or computer, analog and/or digital input/output connections, stepper motor controller boards, etc.

While not shown in FIG. 9, tool 900 may include any feature of reactor 800, such as the gases and piping for each station described above, as well as the vacuum pump.

In some embodiments, system controller 950 controls all of the activities of process tool 900. System controller 950 executes system control software 958 stored in mass storage device 954, loaded into memory device 956, and executed on processor 952. System control software 958 may include instructions for controlling the timing, mixture of gases, chamber and/or station pressure, chamber and/or station temperature, purge conditions and timing, wafer temperature, RF power levels, frequencies, substrate, pedestal, chuck and/or susceptor position, and other parameters of a particular process performed by process tool 900. System control software 958 may be configured in any suitable way. For example, various process tool component subroutines or control objects may be written to control operation of the process tool components necessary to carry out various process tool processes in accordance with the disclosed methods. System control software 958 may be coded in any suitable computer readable programming language.

In some embodiments, system control software 958 may include input/output control (IOC) sequencing instructions for controlling the various parameters described above. For example, each PECVD process may include one or more instructions for execution by system controller 950. The instructions for setting process conditions for a PECVD process phase may be included in a corresponding PECVD recipe phase. In some embodiments, the PECVD recipe phases may be sequentially arranged, so that all instructions for a PECVD process phase are executed concurrently with that process phase.

Other computer software and/or programs stored on mass storage device 954 and/or memory device 956 associated with system controller 950 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 918 and to control the spacing between the substrate and other parts of process tool 900.

A process gas control program may include code for controlling gas composition and flow rates and optionally for flowing gas into one or more process stations prior to deposition to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

The system controller 950, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet.

The remote computer may include a user interface that enables entry or programming of parameters and/or settings, which are then communicated to the system from the remote computer. In some examples, the system controller 950 receives instructions in the form of data, which specify parameters for each of the processing steps to be performed during one or more operations. It should be understood that the parameters may be specific to the type of process to be performed and the type of tool that the controller is configured to interface with or control. Thus, as described above, the system controller 950 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In some embodiments, there may be a user interface associated with system controller 950. The user interface may include a display screen, graphical software displays of the apparatus and/or process conditions, and user input devices such as pointing devices, keyboards, touch screens, microphones, etc.

In some embodiments, parameters adjusted by system controller 950 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 950 from various process tool sensors. The signals for controlling the process may be output on the analog and digital output connections of process tool 900. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, California, or any of a variety of other commercially available processing systems. Two or more of the stations may perform the same functions. Similarly, two or more stations may perform different functions. Each station can be designed/configured to perform a particular function/method as desired.

PECVD Processing

Many semiconductor fabrication processes deposit materials using plasma-enhanced chemical vapor deposition ("PECVD"). In a typical PECVD reaction, a substrate is exposed to one or more volatile precursors which react and/or decompose to produce the desired deposit on the substrate surface. The PECVD process generally begins by flowing one or more reactants into the reaction chamber. The reactant delivery may continue as a plasma is generated which exposes the substrate surface to the plasma, which in turn causes deposition to occur on the substrate surface. This process continues until a desired film thickness is reached, after which the plasma is generally extinguished and the reactant flow is terminated. Next, the reaction chamber may be purged and post-deposition steps may be performed.

As stated above, in some implementations, the frequency used to drive plasma formation during the PECVD may contain a high frequency ("HF") component, a low frequency ("LF") component, or both. The HF frequency may be about 13.56 MHz or about 27 MHz. The HF RF power used to drive plasma formation may be between about 200-3,000 W. These power levels represent the total power delivered, which may be divided among the stations in a multi-station processing chambers. The plasma may generated at a first power level which may be any power within this range, such as 600 W for a single station or 2,400 W for a four-station processing chamber which results in 600 W for each of the four stations. The duration of plasma exposure depends on the desired thickness of the deposited film. In some embodiments, pulsed PECVD methods may be used. These methods may involve pulsing precursor and/or RF power levels. In some embodiments, the frequency used to drive plasma formation during PECVD may contain both LF and HF components. The LF frequency may be between about 300-400 kHz. The LF RF power used to drive plasma formation may be between about 200-2,500 W.

Atomic Layer Deposition

In some embodiments, some semiconductor processing involves multiple film deposition cycles, each producing a "discrete" film thickness. Atomic layer deposition (ALD) is one such film deposition method, but any technique which puts down thin layers of film and used in a repeating sequential matter may be viewed as involving multiple cycles of deposition, and the methods and apparatuses disclosed herein may also be used generally for controlling film thickness in such multi-cycle deposition operations.

As device and features size continue to shrink in the semiconductor industry, and also as 3D devices structures (e.g., Intel's Tri-Gate transistor architecture) become more prevalent in integrated circuit (IC) design, the capability of depositing thin conformal films (films of material having a uniform thickness relative to the shape of the underlying structure, even if non-planar) will continue to gain importance. ALD is a film forming technique which is well-suited to the deposition of conformal films due to the fact that a single cycle of ALD only deposits a single thin layer of material, the thickness being limited by the amount of one or more film precursor reactants which may adsorb onto the substrate surface (i.e., forming an adsorption-limited layer) prior to the film-forming chemical reaction itself. Multiple "ALD cycles" may then be used to build up a film of the desired thickness, and since each layer is thin and conformal, the resulting film substantially conforms to the shape of the underlying devices structure. In certain embodiments, each ALD cycle includes the following steps:

1. Exposure of the substrate surface to a first precursor.
2. Purge of the reaction chamber in which the substrate is located.
3. Activation of a reaction of the substrate surface, typically with a plasma and/or a second precursor.
4. Purge of the reaction chamber in which the substrate is located.

The duration of each ALD cycle is typically less than 25 seconds or less than 10 seconds. The plasma exposure step (or steps) of the ALD cycle may be of a short duration, such as a duration of 1 second or less. Due to the short duration, control of plasma consistency can promote process uniformity. Variations in plasma impedance and power delivered are two factors which may affect process uniformity.

Apparatus and methods are provided to control RF power used in multi-cycle deposition operations in a semiconductor tool with multiple processing stations that share an RF power source. The frequency of the RF power and the power applied to individual stations that share an RF power source are controlled.

Figure 10:
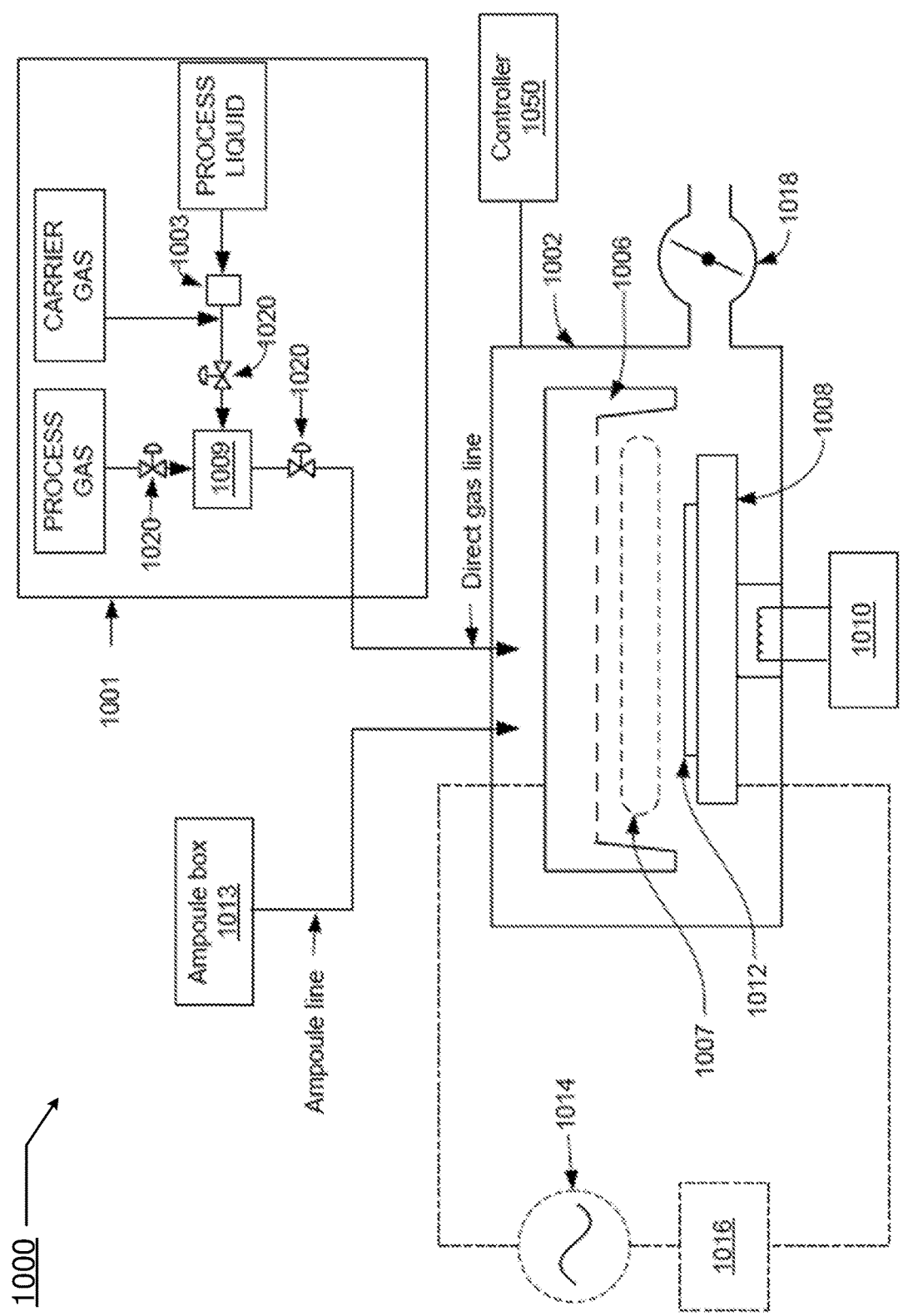
FIG. 10 shows a substrate processing apparatus for depositing films on semiconductor substrates.

FIG. 10 shows a substrate processing apparatus for depositing films on semiconductor substrates, according to an embodiment. The processing apparatus 1000 of FIG. 10 has a single processing chamber 1002 with a single substrate holder 1008 in an interior volume which may be maintained under vacuum by vacuum pump 1018. Also fluidically coupled to the chamber for the delivery of (for example) film precursors, carrier and/or purge and/or process gases, secondary reactants, etc. is gas delivery system 1001 and showerhead 1006. Equipment for generating a plasma within the processing chamber is also shown in FIG. 10. The apparatus schematically illustrated in FIG. 10 provides the basic equipment for performing film deposition operations such as chemical vapor deposition (CVD) or ALD on semiconductor substrates.

Figure 11:
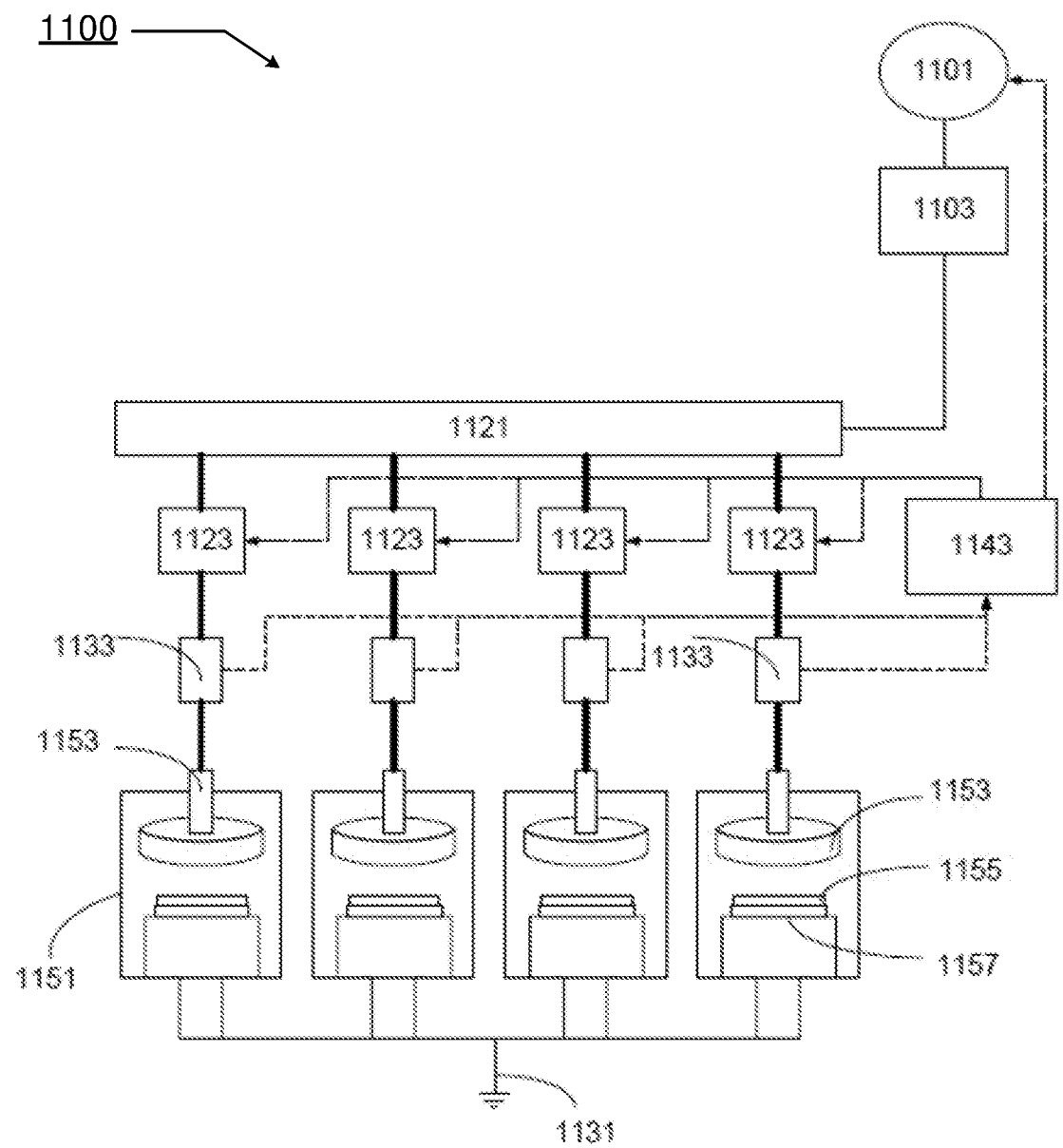
FIG. 11 depicts an implementation of a multi-station processing tool.

For simplicity, processing apparatus 1000 is depicted as a standalone process station having a process chamber body for maintaining a low-pressure environment. However, it will be appreciated that a plurality of process stations may be included in a common process tool environment—e.g., within a common reaction chamber—as described herein. For example, FIG. 11 depicts an implementation of a multi-station processing tool, according to an embodiment 1100. Further, it will be appreciated that, in some implementations, one or more hardware parameters of processing apparatus 1000, including those discussed in detail above, may be adjusted programmatically by one or more system controllers.

Processing apparatus 1000 fluidly communicates with reactant delivery system 1001 for delivering process gases to a distribution showerhead 1006. Reactant delivery system 1001 includes a mixing vessel 1004 for blending and/or conditioning process gases for delivery to showerhead 1006. One or more mixing vessel inlet valves 1020 may control introduction of process gases to mixing vessel 1009.

Some reactants may be stored in liquid form prior to vaporization and subsequent delivery to the process chamber 1002. The implementation of FIG. 10 includes a vaporization point 1003 for vaporizing liquid reactant to be supplied to mixing vessel 1009. In some implementations, vaporization point 1003 may be a heated liquid injection module. In some other implementations, vaporization point 1003 may be a heated vaporizer. In yet other implementations, vaporization point 1003 may be eliminated from the process station.

In some implementations, a liquid flow controller (LFC) upstream of vaporization point 1003 may be provided for controlling a mass flow of liquid for vaporization and delivery to processing chamber 1002.

Showerhead 1006 distributes process gases and/or reactants (e.g., film precursors) toward substrate 1012 at the process station, the flow of which is controlled by one or more valves upstream from the showerhead (e.g., valves 1020). In the implementation shown in FIG. 10, substrate 1012 is located beneath showerhead 1006, and is shown resting on a pedestal 1008. Showerhead 1006 may have any suitable shape, and may have any suitable number and arrangement of ports for distributing processes gases to substrate 1012.

A volume 1007 is located beneath showerhead 1006. In some implementations, pedestal 1008 may be raised or lowered to expose substrate 1012 to volume 1007 and/or to vary a volume of volume 1007. Optionally, pedestal 1008 may be lowered and/or raised during portions the deposition process to modulate process pressure, reactant concentration, etc. within volume 1007.

In FIG. 10, showerhead 1006 and pedestal 1008 are electrically connected to RF power supply 1014 and matching network 1016 for powering a plasma. In some implementations, the plasma energy may be controlled (e.g., via a system controller having appropriate machine-readable instructions) by controlling one or more of a process station pressure, a gas concentration, an RF source power, an RF source frequency, and a plasma power pulse timing. For example, RF power supply 1014 and matching network 1016 may be operated at any suitable power to form a plasma having a desired composition of radical species. Likewise, RF power supply 1014 may provide RF power of any suitable frequency.

In some implementations, the plasma may be monitored in-situ by one or more plasma monitors. In one scenario, plasma power may be monitored by one or more voltage, current sensors (e.g., load sensors such as VI probes). Examples of such sensors include MKS VI-Probe-4100 and 350. Such sensors may measure the voltage, current, and phase differences. In certain implementations, the sensors may be electrically connected to the RF power supply and may be located at or near the showerhead. In such implementations, the impedance, as presented to the output port of an RF generator may be representative of the impedance of the plasma. In another scenario, plasma density and/or process gas concentration may be measured by one or more optical emission spectroscopy (OES) sensors. In some implementations, one or more plasma parameters may be programmatically adjusted based on measurements from such in-situ plasma monitors. For example, a load sensor may be used in a feedback loop for providing programmatic control of plasma power. It will be appreciated that, in some implementations, other monitors may be used to monitor the plasma and other process characteristics. Such monitors may include, but are not limited to, infrared (IR) monitors, acoustic monitors, and pressure transducers.

In some implementations, the plasma may be controlled via input/output control (IOC) sequencing instructions. In one example, the instructions for setting plasma conditions for plasma activation may be included in a corresponding plasma activation recipe of a process recipe. In some cases, process recipes may be sequentially arranged, so that all instructions for a process are executed concurrently with that process. In some implementations, instructions for setting one or more plasma parameters may be included in a recipe preceding a plasma process. For example, a first recipe may include instructions for setting a flow rate of an inert (e.g., helium) and/or a reactant gas, instructions for setting a plasma generator to a power set point, and time delay instructions for the first recipe. A second, subsequent recipe may include instructions for enabling the plasma generator and time delay instructions for the second recipe. A third recipe may include instructions for disabling the plasma generator and time delay instructions for the third recipe. It will be appreciated that these recipes may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of less than 50 milliseconds, with 25 milliseconds being a specific example. Such short RF plasma strikes require quick stabilization and tuning of the plasma. To accomplish the quick stabilization and tuning of the plasma, the plasma generator may be configured through a two-step tuning process that includes a coarse-tuning component and a fine-tuning component. In the coarse-tuning component, the impedance match may be preset to a particular impedance. The coarse tuning component may be preset such that a magnitude of the impedance is at a value of, for example, 50 ohms. In certain implementations, the coarse tuning component may be limited to adjustments affecting the magnitude of the impedance. In the fine-tuning component, the RF frequency may be allowed to float from a baseline frequency in order to attempt to match the phase to a target value, such as a phase value of zero. Conventionally, high-frequency plasmas are generated at a frequency of about 13.56 MHz. In various implementations disclosed herein, the frequency may be allowed to float to a value that is different from this standard value in order to match the phase to the target value. In certain implementations, the fine-tuning component may be limited to adjustments affecting the phase of the impedance. By permitting the frequency to float while fixing the impedance match to a predetermined impedance, the plasma can stabilize much more quickly. Very short plasma strikes, such as strikes associated with ALD or atomic layer etching (ALE) cycles, may benefit from quick stabilization of the plasma.

The first 1-2 milliseconds of a typical deposition cycle involve the ignition of the plasma. After ignition of the plasma, the fine tuning of the RF frequency is then carried out to match the plasma phase to the target value.

As described above, one or more process stations may be included in a multi-station substrate processing tool. FIG. 11 shows an example multi-station substrate processing apparatus that may utilize plasma balancing hardware. Various efficiencies may be achieved through the use of a multi-station processing apparatus like that shown in FIG. 11 with respect to both equipment cost and operational expenses. For instance, a single vacuum pump may be used to create a single high-vacuum environment for all four process stations by evacuating spent process gases, etc. for all four process stations. Depending on the implementation, each process station may have its own dedicated showerhead for gas delivery, but may share the same gas delivery system. Likewise, certain elements of the plasma generator equipment may be shared amongst process stations (e.g., power supplies), although depending on the implementation, certain aspects may be process station-specific (for example, if showerheads are used to apply plasma-generating electrical potentials). Once again, it is to be understood that such efficiencies may also be achieved to a greater or lesser extent by using more or fewer numbers of process stations per processing chamber such as 2, 3, 5, 6, 7, 8, 9, 10, 11, 12, 13, 14, 15, or 16, or more process stations per reaction chamber.

The substrate processing apparatus of FIG. 9 may also be employed to perform ALD processing. Here, the single substrate processing chamber 914 contains multiple substrate process stations, each of which may be used to perform processing operations on a substrate held in a wafer holder at that process station. In this particular implementation, the multi-station substrate processing tool 900 is shown having four process stations 1, 2, 3, and 4. Other similar multi-station processing apparatuses may have more or fewer processing stations depending on the implementation and, for instance, the desired level of parallel wafer processing, size/space constraints, cost constraints, etc.

In FIG. 9, the RF power is generated at an RF power system 913 and distributed to each of the stations 1-4. The RF power system may include one or more RF power sources, e.g., a high frequency (HFRF) and a low frequency (LFRF) source, impedance matching modules, and filters. In certain implementation, the power source may be limited to only the high frequency or low frequency source. Unless otherwise stated, assume that the described deposition processes employ only high frequency power. The distribution system of the RF power system is symmetric about the reactor and has high impedance. This symmetry and impedance result in approximately equal amounts of power being delivered to each station. Small differences in RF power, in the order of 5 to 15%, may arise from tolerances in distribution system components, station alignments, temperature differences, and process conditions.

Small differences in RF power can cause wafer-to-wafer non-uniformity in a variety of film characteristics, e.g., composition, thickness, density, amount of cross-linking, chemistry, reaction completion, stress, refractive index, dielectric constant, hardness, etch selectivity, stability, hermeticity, etc. The ability to fine-tune plasma power at individual stations and to dynamically respond to changing station conditions may decrease wafer-to-wafer non-uniformity. Note that the present method and apparatus are not limited to a multi-station reactor; the method and apparatus disclosed herein applies to other RF power systems where multiple processing areas share an RF power source.

The system controller 950 may also be employed to control process conditions and hardware states of process tool 900 and its process stations for performing ALD. System controller 950 may provide machine-readable instructions for implementing deposition processes. The instructions may control a variety of process parameters, such as DC power level, RF bias power level, station-to-station variations such as RF power parameter variations, frequency tuning parameters, pressure, temperature, etc. The instructions may control the parameters to operate in-situ deposition of film stacks according to various implementations described herein.

FIG. 11 is a schematic diagram showing various components in an example multi-station plasma reactor with multiple stations sharing an RF power source utilizing RF frequency tuning. As shown, an RF power source 1101, which may be a high frequency RF power source, is distributed via a distribution network 1121 to multiple stations 1151. The HFRF may have a frequency of about 2-60 MHz, or about 13.56 MHz. In other implementations, a low frequency RF power source may be used in addition to or in place of the high frequency RF power source. The low frequency RF power source may have a frequency of about 100 kHz to about 1 MHz, or about 400 kHz. Certain commercially available RF power sources include the ability to tune the frequency of the RF power. Examples of such RF power sources include Advanced Engineer's Paramount series, MKS's SurePower series, Comdel's CB, CLX, and CDX series, and Huettinger's TruPlasma series.

The power from the RF power source 1101 may be routed through an impedance matching system that may include a fixed match module 1103. In certain implementations that contain both the high and the low frequency RF power source, a high-pass filter and/or a low-pass filter may also be present. Additionally, in certain implementations, the power from the RF power source may be routed through an auto match module. Implementations that include the low frequency RF power source, whether in addition to or in place of the high frequency RF power source, low frequency power may be routed through either a fixed or auto match. In certain implementations, an auto match module may be used to match the RF power frequency to a set impedance of a load of the plasma. In other implementations, a fixed match module, which does not automatically match the RF power frequency to a set impedance of a load of the plasma, may be used.

In the implementation shown in FIG. 11, the RF power source 1101 is connected to the distribution network 1121. The distribution network 1121 may distribute the RF power generated by the RF power source 1101 to each of the multiple stations 1151. The distribution network 1121 is connected to an RF adjuster 1123 for each of the multiple stations 1151. For each of the multiple stations 1151, the RF adjuster 1123 is connected to a power parameter sensor 1133 before the showerhead 1153. The power parameter sensor 1133 may be a sensor of any type previously disclosed, such as a load sensor or an OES sensor. The RF power source 1101 may obtain instructions from the RF controller 1143 and vary the frequency of the RF power distributed to the stations. The instructions may be a frequency adjustment according to the impedance as detected by the one or more power parameter sensors 1133. In other implementations, an additional sensor may measure a final phase that is representative of the phase of the plasmas in all of the stations 1151. The RF controller 1143 may then vary the frequency of the RF power distributed to the station according to the final phase measured by the additional sensor. In certain implementations, the RF controller 1143 may include instructions, e.g., code, to vary the frequency of the RF power such that the phase of the impedance is zero or near zero. In the implementation shown in FIG. 11, the RF controller 1143 may vary the frequency of the RF power from the RF power source 1101 upstream of the individual stations.

The RF adjuster 1123 is controlled by RF controller 1143. RF controller 1143 may change the RF power at individual stations by a determined amount based on the measurement from the sensors 1133 at each station 1151. In certain implementations, the RF adjusters 1123 may be variable capacitors. The RF controller 1143 may control a stepper motor (not shown) that can vary the capacitance of a variable capacitor. Other ways to vary a capacitance may be used. For example, the RF adjusters 1123 may also be a bank of capacitors with individual switches. The RF power may be controlled by activating (turning on) a number of capacitors having a specified value. For example, capacitors may be selected to add 1 pF, 2 pF, 4 pF, 8 pF, and 16 pF shunt capacitance to the station. In this example, all combinations of active (turned on) and non-active (turned off) capacitors cover the range from 0 pF to 31 pF with 1 pF resolution. By selecting which capacitors to activate, the controller can change the RF power to a station. This digital control can be faster than using a stepper motor to control a variable capacitor, especially when a wide range of capacitance needs to be covered. Depending on the space available and the amount of control required, one skilled in the art would be able to design an RF adjuster using one or more capacitors to change RF power by a certain amount.

In other implementations, the RF adjusters 1123 may be variable coil inductors. The RF controller 1143 may control the variable coil inductors to affect RF power delivered to the station. In certain implementations, the RF adjusters are not limited to capacitor and inductors. In certain implementations, other RF adjusters 1123 may utilize different mechanisms to change the RF power, such as resonator circuits or resistive circuits.

The sensors 1133 measure at least one RF power parameter. The RF power parameter measured may be voltage, current, impedance, phase, or load power. Commercially available probes may be used to measure the RF power parameter and provide the measurement to the RF controller 1143. It is also possible to measure a non-RF parameter and use it as source signal for the RF controller 1143. For example, optical emission from station plasma or substrate temperature sensors can measure station characteristics and feed them to the RF controller 1143. An optical emission system may be installed in the vicinity of each station to collect light emitted by station plasma. A substrate temperature sensor may use remote infrared detection system built under a substrate. The sensor 1133 may also measure multiple RF power parameters, or multiple sensors may be used in certain implementations to measure multiple RF power parameters.

In some implementations, the RF adjusters may be set to a fixed value or range of values over multi-step processes such as a multi-cycle ALD process. In such implementations, there is little or no need for real-time sensing of the RF power parameter(s) and adjustment of the station-to-station distribution of RF power.

Each station 1151 contains a showerhead 1153 working in conjunction with a grounded pedestal 1157. The power and frequency supplied is sufficient to generate a plasma from the process gas, for example within the range of about 50 W to about 6000 W per station. Power levels may vary according to the implementation. RF power is connected to the station processing area via the showerhead 1153 and generates or sustains a plasma when RF power is applied. The plasma causes material to be deposited onto the substrate by a variety of mechanisms. For example, the plasma can cause process gas to break down and react on the substrate surface. In the implementation shown, the RF current is grounded at the pedestals 1157, which are connected to the ground 1131. In certain other implementations, the RF current may be grounded at a different location in the chamber such as at the showerheads.

The plasma activation step of multi-step deposition processes with short cycle durations may be brief. The duration of the plasma activation step may be about 150 milliseconds or less (e.g., about 50 milliseconds). Due to the short durations, control of plasma consistency has an effect on process uniformity. Plasma balancing may be used to control plasma consistency.

Although not shown in FIG. 8-11, any of the tools in these Figures may include any feature of any other tool, such as the controller 950 and the controller may be configured to execute any instruction described herein for reactor 800. Additionally, the chambers identified in embodiments 800, 900, 1000 of FIGS. 8-10, respectively may be considered the chamber 102 of FIG. 1 and the chambers 602A and 602B of FIGS. 6D and 6E, respectively. Additionally, the RF generators 110, 610A, and 610B may also be considered any one, or both, of the HFRF and LFRF generators of FIGS. 8-11.

Unless the context of this disclosure clearly requires otherwise, throughout the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. Additionally, the words "herein," "hereunder," "above," "below," and words of similar import refer to this application as a whole and not to any particular portions of this application. When the word

What is claimed is:

1. A method of detecting an anomalous plasma event in a semiconductor processing chamber, the method comprising:
   detecting an optical signal emitted by a plasma in the semiconductor processing chamber, wherein the plasma is formed in response to an RF signal from an RF generator;
   converting the optical signal to an analog voltage signal;
   filtering the analog voltage signal to form a low-pass filtered voltage signal;
   comparing the low-pass filtered voltage signal with the analog voltage signal to determine whether changes associated with the low-pass filtered voltage signal exceed a threshold; and
   adjusting, based at least in part on the determination, an output parameter of the RF signal from the RF generator.

2. The method of claim 1, wherein the filtering comprises taking a first derivative of the analog voltage signal.

3. The method of claim 1, further comprising:
   determining, based at least in part on light intensity within the semiconductor processing chamber or process parameters, a first amount of RF power reduction, and
   reducing an output power level of the RF generator by the first amount, wherein
   the process parameters include one or more process parameters selected from the group consisting of: DC power level, RF bias power level, station-to-station RF power variations, frequency tuning parameters, pressure, and temperature.

4. The method of claim 1, wherein:
   the comparing comprises comparing the changes of the analog voltage signal to the adjusted analog voltage signal.

5. The method of claim 4, wherein the filtering further comprises applying an offset to the low-pass filtered voltage signal.

6. The method of claim 1, wherein the adjusting of the output parameter of the RF generator comprises lowering an output power of the RF generator from a first power level to a second power level.

7. The method of claim 6, further comprising:
   maintaining, after lowering the output power of the RF generator from the first power level to the second power level, the output power of the RF generator at the second power level for a first time period; and
   after the maintaining, increasing the output power of the RF generator from the second power level to the first power level for a second time period.

8. A semiconductor processing tool comprising:
   a semiconductor processing chamber;
   an RF generator configured to provide RF power to the semiconductor processing chamber to generate and maintain a plasma;
   a photodetector configured to detect an optical signal indicative of a plasma's luminescence in the semiconductor processing chamber, the photodetector configured to convert the optical signal to an analog voltage signal; and
   a slope change detection unit configured to:
   receive the analog voltage signal,
   filter the analog voltage signal to form a low-pass filtered voltage signal,
   compare the low-pass filtered voltage signal with the analog voltage signal to determine whether changes associated with the low-pass filtered voltage signal exceed a threshold, and
   in response to the determination, cause a signal to be sent to the RF generator that is configured to cause an adjustment to the RF generator.

9. The semiconductor processing tool of claim 8, further comprising:
   a lens on the semiconductor processing chamber configured to allow light within the semiconductor processing chamber to pass through the lens, and
   a fiber optic cable between the lens and the photodetector and configured to convey at least a portion of the light that passes through the lens to reach the photodetector.

10. The semiconductor processing tool of claim 8, wherein the slope change detection unit further comprises:
    a comparator to compare changes between the low-pass filtered voltage signal with the analog voltage signal.

11. The semiconductor processing tool of claim 8, wherein the RF generator is configured to reduce the RF power from a first power level to a second power level in response to receiving the signal from the slope change detection unit.

12. The semiconductor processing tool of claim 8, wherein the slope change detection unit further comprises:
    a differentiator configured to take a derivative of the analog voltage signal to convert the analog voltage signal to an adjusted analog voltage signal, and
    a comparator configured to determine whether the changes of the adjusted analog voltage signal exceed the threshold.

13. The semiconductor processing tool of claim 8, further comprising:
    a fiber optic cable between the semiconductor processing chamber and the photodetector are configured to transmit light generated by the plasma in the semiconductor processing chamber to reach the photodetector.

14. The semiconductor processing tool of claim 8, wherein:
    the photodetector is electrically connected to the RF generator, and
    the optical signal from the semiconductor processing chamber is fed from the semiconductor processing chamber to the RF generator.

15. The semiconductor processing tool of claim 8, wherein:
    the photodetector and the slope change detection unit are positioned outside the semiconductor processing chamber or on the semiconductor processing chamber.

16. A method of detecting an anomalous plasma event comprising:
    forming a plasma utilizing a signal from an RF generator;
    detecting a fluctuating optical signal generated by the plasma;
    computing a spectral density of the fluctuating optical signal; and
    determining that the spectral density of the fluctuating optical signal differs from one or more reference spectral densities of a fluctuating optical signal, generated by the plasma, by a threshold amount, wherein computing the spectral density of the fluctuating optical signal comprises determining the spectral density of the fluctuating optical signal at a frequency of about 400 kHz or between about 400 kHz and about 4 MHz.

17. The method of claim 16, wherein computing the spectral density of the fluctuating optical signal comprises utilizing a Fast Fourier Transform.

18. The method of claim 16, wherein the one or more reference spectral densities of a fluctuating optical signal correspond to spectral densities of a fluctuating optical signal generated by a plasma maintained under nominal conditions.

19. The method of claim 18, wherein the threshold amount corresponds to one standard deviation relative to the spectral density of the fluctuating optical signal from the plasma maintained under nominal conditions.

* * * * *